United States Patent [19]
Nagase et al.

[11] Patent Number: 5,812,434
[45] Date of Patent: Sep. 22, 1998

[54] ELECTROMAGNETIC FIELD STRENGTH CALCULATOR HAVING FUNCTION OF DISPLAYING CURRENTS TO BE ANALYZED

[75] Inventors: Kenji Nagase; Sekiji Nishino; Tatsro Shima, all of Kawasaki, Japan

[73] Assignee: Fujitsu Limited, Kawasaki, Japan

[21] Appl. No.: 661,916

[22] Filed: Jun. 12, 1996

[30] Foreign Application Priority Data

Jun. 16, 1995 [JP] Japan .................................. 7-149947

[51] Int. Cl.$^6$ ........................... G06F 17/50; G06F 17/10
[52] U.S. Cl. ........................................... 364/578; 364/489
[58] Field of Search ............................ 364/578, 488–491

[56] References Cited

U.S. PATENT DOCUMENTS

| | | | |
|---|---|---|---|
| 4,969,116 | 11/1990 | Wada et al. | 364/578 |
| 5,537,329 | 7/1996 | Feldmann et al. | 364/489 |
| 5,566,083 | 10/1996 | Fang | 364/489 |
| 5,625,578 | 4/1997 | Du Cloux et al. | 364/578 |

FOREIGN PATENT DOCUMENTS

| | | | |
|---|---|---|---|
| 40 13 017 | 10/1991 | Germany | G01R 19/08 |
| 40 13 017 A1 | 10/1991 | Germany . | |
| 196 16 772 | 10/1996 | Germany | G06F 17/50 |
| 196 16 772 A1 | 10/1996 | Germany . | |

OTHER PUBLICATIONS

Dominek, A. et al. ("Edge wave visualization", IEEE Antennas and Propagation Magazine, vol. 33, No. 2, Apr. 1991, pp. 22–28).

Kahrizi, M. et al. ("Space domain approach for the analysis of printed circuits", IEEE Transactions on Microwave Theory and Techniques, vol. 42, No. 3, Mar. 1994, pp. 450–457).

Wang J. J. H. ("Generalized moment methods in electromagnetic", IEE Proceedings H [Microwaves, Antennas and Propagation] vol. 137, No. 2, Apr. 1990, pp. 127–132).

Martin, R. G. ("Time–domain integral equation methods for transient analysis", IEEE Antennas and Propagation Magazine, vol. 34, No. 3, Jun. 1992, pp. 15–23).

PTO 98–0361(Translation of DE 40 13 017, translated Nov. 1997 by the Schreiber Translations, Inc.).

PTO 98–0351 (Translation of DE 196 16 772, translated Nov. 1997 by the Ralph McElroy Translation Company).

Newman, et al., "Considerations for Efficient Wire Surface Modeling", IEEE Transactions on Antennas and Propagation, AP–28, No. 1, pp. 121 et seq.

*Primary Examiner*—Emanuel Todd Voeltz
*Assistant Examiner*—Phallaka Kik
*Attorney, Agent, or Firm*—Staas & Halsey

[57] ABSTRACT

An electromagnetic field strength calculator calculates currents flowing through an electric circuit device which is an object of analysis by means of the moment method, and calculates and displays the strength of an electromagnetic field radiated from the electric circuit device from the calculated currents. In this calculator, a grid setup unit partitions a plane of a model representing the circuit device with a grid of lines having specified spacing. Next, a current calculation unit calculates currents at grid intersections or points within areas partitioned by the grid, on the basis of currents flowing through an element of the model of the circuit device calculated by means of the moment method. The currents thus calculated are displayed on a display by a current display unit. This allows a current at a point in the electric circuit device to be visually displayed in a form easy to understand.

33 Claims, 22 Drawing Sheets

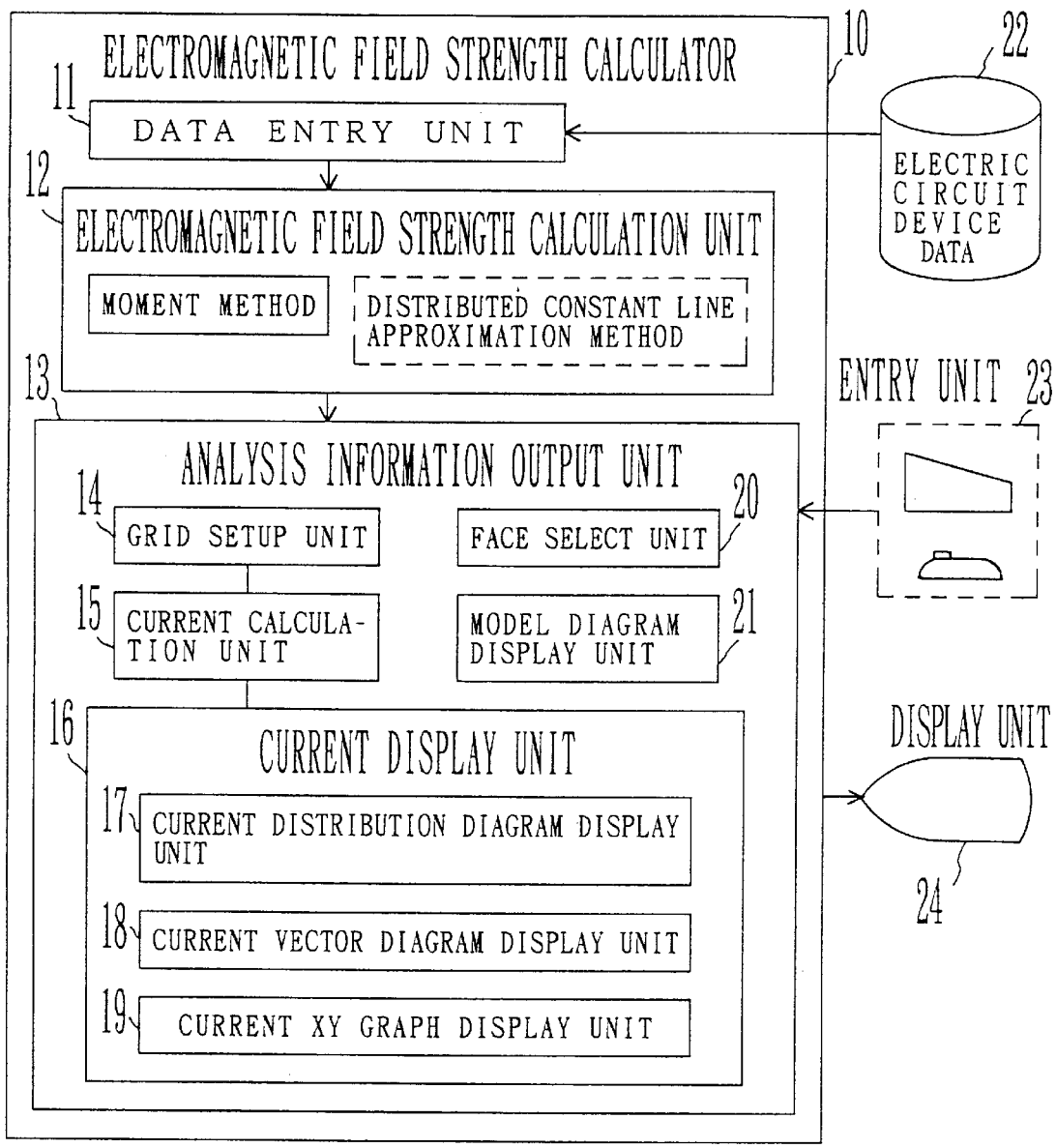
F I G. 1 A

E1~E9 : ELEMENTS

P1~P11 : INTERSECTIONS

— MODEL
— ELEMENT
---- GRID

| CURRENT VALUE (RELATIVE TO A STANDARD VALUE) | VECTOR COLOR |
|---|---|
| 100 TIMES OR MORE | RED |
| 10 TIMES OR MORE | ORANGE |
| 1/10 - LESS THAN 10 TIMES | YELLOW |
| LESS THAN 1/10 TIMES | GREEN |
| 1/100 TIMES OR LESS | BLUE |

CERRENT DENSITY IN THREE DIRECTION

COORDINATE SYSTEM OF GRID

ELECTROMAGNETIC FIELD STRENGTH CALCULATOR HAVING FUNCTION OF DISPLAYING CURRENTS TO BE ANALYZED

BACKGROUND OF THE INVENTION

1. Field of the Invention

This invention relates to an electromagnetic field strength calculator for calculating the strength of an electromagnetic field emitted from an electric circuit device by means of the moment method, and more specifically, to an electromagnetic field strength calculator capable of calculating and displaying currents flowing through an electric circuit device which is an object of analysis.

2. Description of the Related Art

Recently, undesired electromagnetic waves radiated from electric circuit devices have been strictly regulated in various countries because they interfere with other electromagnetic devices such as televisions, radios, etc. Examples of standards for such a regulation include the VCCI standards in Japan, the FCC standards in U.S.A., and the VDE standards in Germany.

In order to satisfy such a regulation, it is required to use various countermeasure techniques, such as shielding techniques, filtering techniques, etc. Further, there is a need for a technique to simulate quantitatively how far the undesired electromagnetic waves are reduced by those countermeasure techniques. In a simulation of electromagnetic wave analysis, currents flowing through each element in an electric circuit device are calculated for the purpose of calculating of the strength an electromagnetic field emitted from that electric circuit device. If, at this point, how currents flow could be visually indicated by using a suitable method, it would become possible to grasp defects in calculations and to locate sources of electromagnetic waves. Further, the visual indication of currents would also be very useful in making the mechanism of radiation clear.

The strength of electromagnetic waves emitted from an object of any shape can be easily calculated using a known theoretical formula, if a current flowing through each part of that object is known. Theoretically, the current values are obtained by solving Maxwell's electromagnetic wave equations under given boundary conditions. At present, however, no direct mathematical solution under complex boundary conditions for an object of any shape is known.

Therefore, all the methods for calculating currents used in current electromagnetic wave strength calculators are based on approximate calculations, even if the difficulty differs from method to method. At present, typical approximate solutions include the microloop antenna approximation method, the distributed constant line approximation method, and the moment method.

With the microloop antenna approximation method, a wire connecting a wave source circuit with a load circuit is treated as a loop antenna, and a current in the loop, which is assumed to be flat, is calculated by the algorithm for lumped constant circuits. The calculation by the microloop antenna approximation method is most straightfoward. However, it is rarely used in practice because the precision is significantly decreased in the case where the dimension of the loop cannot be neglected in comparison with the wavelength of the radiated electromagnetic waves.

In the distributed constant line approximation method, a current is obtained by applying a distributed constant line equation to an object that can be approximated by a one-dimensional structure. The calculation is relatively simple, however the calculation time and data to be stored increase in substantial proportion to the number of elements to be analyzed, especially if analyses of the phenomena of reflection and resonance by a line, etc., are included. Thus, high-speed, high-precision analyses can be made for objects which can be approximated by one-dimensional structures. A problem with the distributed constant line approximation method is that no analysis can be made of any object that cannot be approximated by a one-dimensional structure.

The moment method obtains the solutions using the integral equation derived from Maxwell's wave equations, and can handle three-dimensional objects of any shape. To be specific, an object is divided into small elements for the calculation of currents. Since the moment method can handle three-dimensional objects of any shape, the moment method is most suitable for use with electromagnetic field strength calculators for calculating the strength of an electromagnetic field generated by an electric circuit device.

When the moment method is used, a metal portion included in an object is divided into parts in the form of a mesh, and the mutual impedances $Zij$ between the divided metal parts are calculated. The following simultaneous equation according to the moment method applies to mutual impedances $Zij$, wave sources $Vi$, and currents $Ii$ flowing through the divided metal parts:

$$[Zij][Ii]=[Vi]$$

The currents $Ii$ can be obtained by solving the equation. The strength of an electromagnetic field is calculated from the resulting currents $Ii$. The symbol "[ ]" represents values for a matrix.

The following is a reference describing the moment method:

H. N. Wang, J. H. Richmond, and M. C. Gilreath, "Sinusoidal reaction formulation for radiation and scattering from a conducting surface" IEEE TRANSACTIONS ON ANTENNAS AND PROPAGATION, vol. AP-23, 1975.

As described above, the currents calculated using the moment method in an electromagnetic field strength calculator are used for calculating the strength of an electromagnetic field according to the known equations. In the prior art, such currents are intermediate results in the process of calculation of the electromagnetic field strength, and visual indication of the calculated currents has not yet been realized. With the moment method, the current is calculated for each side of a respective one of the elements (called patches) in the form of meshes. For this reason, if the elements are large, not arranged in an orderly manner, or not uniform in size, a visual indication of calculated currents cannot be utilized.

SUMMARY OF THE INVENTION

In order to increase the precision of detecting the strength of an electromagnetic field radiated from an electric circuit device, it is important to determine the details of currents causing the electromagnetic field. Also, the detailed visual indication of these currents is very important in order to understand the mechanism of the radiation of electromagnetic waves. Further, a visual indication of the currents will provide information for the next mesh division of the electric circuit device that has been analyzed, or an electric circuit device of a similar shape which is currently being analyzed.

It is an object of the invention to calculate currents at arbitrary points on elements of an electric circuit device and visually display how the currents flow, in a form easy to view and understand, irrespective of the shape of the elements.

An electromagnetic field strength calculator of the invention calculates currents flowing through an electric circuit device, which is an analysis object, by means of the moment method or the distributed constant line approximation method, and calculates and displays the strength of an electromagnetic field radiated from the circuit device on the basis of the calculated currents. This calculator comprises: a grid setup unit for partitioning a face of a model representing the electric circuit device with a grid of lines having specified spacing; a current calculating unit for, on the basis of currents flowing through an element of the model of the circuit device which are calculated by means of one of the moment method and the distributed constant line approximation method, calculating currents at either intersections of lines of the grid or points within areas partitioned by the lines of the grid; and a current display unit for displaying the currents calculated by the current calculating unit.

An electromagnetic field strength calculating method of the invention is for calculating currents flowing through an electric circuit device, which is an analysis object, by means of one of the moment method and the distributed constant line approximation method, and calculating and displaying the strength of an electromagnetic field radiated from the circuit device on the basis of the currents calculated. This method comprises the steps of: calculating currents flowing through an element of a model representing the electric circuit device by means of the moment method or the distributed constant line approximation method; partitioning a face of the model with a grid of lines having specified spacing; calculating, on the basis of the currents flowing through the element of the model, currents at either intersections of lines of the grid or points within areas partitioned by the lines of the grid; and displaying the currents calculated.

A storage medium of the invention is a computer-readable storage medium embodying a program of instructions executable by a computer to perform an electromagnetic field strength calculating method for calculating currents flowing through an electric circuit device, which is an analysis object, by means of one of the moment method and the distributed constant line approximation method, and calculating and displaying the strength of an electromagnetic field radiated from the circuit device on the basis of the currents calculated. The program stored in this storage medium is for carrying out the steps of the electromagnetic field strength calculating method described above.

According to the invention, it is possible to calculate a current at any point in an electric circuit device. Therefore, the current distribution in the circuit device and how currents flow therein can be displayed in detail in a form easy to understand, without depending on the shape of a model element determined by the moment method. Thereby, how electromagnetic waves are radiated from the circuit device can be known easily and information useful to make clear the mechanism of radiation of electromagnetic waves from the circuit device can be obtained.

BRIEF DESCRIPTION OF THE DRAWINGS

FIG. 1A is a schematic diagram showing the basic configuration of an electromagnetic field strength calculation system of the invention;

DESCRIPTION OF THE PREFERRED EMBODIMENT

Figure 1B:
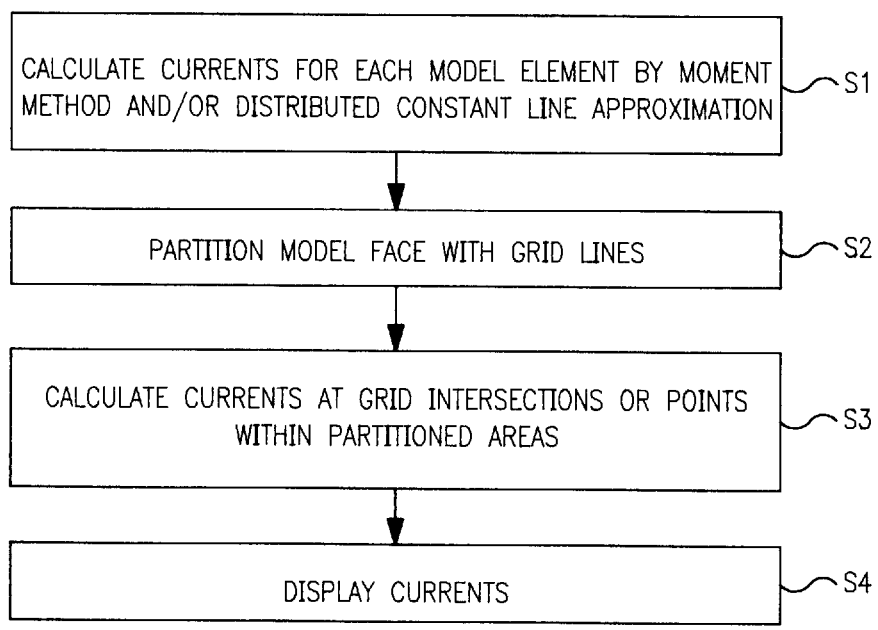
FIG. 1B shows the basic procedure for an electromagnetic field strength calculation algorithm of the invention.

Referring now to FIG. 1A, there is shown a basic configuration of an electromagnetic field strength calculation system of the invention. An electromagnetic field strength calculator 10 is equipped with a central processing unit (CPU) and memories and calculates the strength of an electromagnetic field radiated from an electric circuit device which is an object of analysis by means of the moment method or the distributed constant line approximation method.

A data entry unit 11 is adapted to enter electric circuit device data 22 such as data on the structure of the electric circuit device and the like. An electromagnetic field strength calculation unit 12 calculates the strength of an electromagnetic field by partitioning the object of analysis into patches, or microelements, and calculating a current flowing through each microelement by means of the moment method. The distributed constant line approximation method may be used to calculate currents flowing through a portion of the electric circuit device to which the method can be applied.

An analysis information output unit 13 graphically displays the strength of an electromagnetic field calculated by the electromagnetic field strength calculation unit 12, in a specified form. In the invention, not only the electromagnetic field strength but also the currents flowing in the electric circuit device and calculated by the calculation unit 12 are. displayed.

The analysis information output unit 13 includes a grid setup unit 14 which partitions a face of an electric circuit device model with a grid of lines having a specified or predetermined line spacing, a current calculation unit 15 which calculates a current at a grid intersection or a point within the space partitioned by grid lines, on the basis of currents flowing through an element in the electric circuit device which have been calculated by means of the moment method, and a current display unit 16 which displays the currents calculated by the current calculation unit 15 on a display 24.

The current display unit 16 includes a current distribution diagram display unit 17 which performs vector resolution of the currents calculated by the current calculation unit 15 on an orthogonal coordinate system and three-dimensionally or axonometrically displays the results on a hidden-surface-removed distribution diagram. The current distribution diagram displayed by the display unit 24, is a three-dimensional graph on the XYZ orthogonal coordinate system in which a face of a model representing an electric circuit device to be analyzed is indicated on the XY plane, and currents are indicated as Z-axis components.

The current display unit 16 further includes a current vector diagram display unit 18 which displays each of the currents calculated by the current calculation unit 15 on the corresponding face of the displayed model, in the form of an arrow in such a way that its direction represents the current direction and its length represents the current magnitude. The current vector diagrams obtained by the current vector diagram display unit 18 represent the magnitude and direction of the currents at all the grid intersections on the corresponding points in the face of the model.

The grid setup unit 14 surrounds a face of the model with a rectangular area lying in the same plane and partitions the rectangular area with the lines of a grid, thereby expressing the rectangular area as a set of subareas partitioned by the lines of the grid.

The grid setup unit 14 partitions a face representing the model and having at least one of a triangular element and a quadrangular element into a plurality of subareas by the lines of the grid. The current calculation unit 15 calculates a current corresponding to each of the areas using currents calculated for each side of at least one of the triangular and square elements on the basis of the moment method.

The electromagnetic field strength calculator 10 of the invention further includes a face select unit 20 which receives ah input specifying one point or one element of the model of the electric circuit device and selects a face on which the specified point or element lies as an object plane for current display by the current display unit 16.

The current display unit 16 further includes a current XY graph display unit 19 which divides a current calculated by the current calculation unit 15 into a real part and an imaginary part, and displays the divided current. The current XY graph display unit 19 also displays a current calculated by the current calculation unit 15 in terms of an absolute value and phase.

The electromagnetic field strength calculator 10 further includes a model diagram display unit 21 which displays a diagram of the model of the electric circuit device and indicates the object face for the current display by the current display unit 16 on the face of the model.

The current vector diagram display unit 18 can display a current in a plurality of scales by changing the mode of display of the arrows according to the magnitude of that current.

The current XY graph display unit 19 can display currents calculated by the current calculation unit 15 in the form of an XY graph, in which the X axis represents the position of points specified as candidates for the current display, and the Y axis represents the magnitude of the currents.

The points the current XY graph display unit 19 displays may be determined by specifying the starting point or value and the end point or value of the points.

The current calculation unit 15 can also calculate the distribution of current in a wire element in the electric circuit device. The current XY graph display unit 19 in the current display unit 16 can also display an XY graph, in which the X axis represents the position of points on the wire element and the Y axis represents the magnitude of currents at those points.

FIG. 1B is a flowchart illustrating the basic procedure according to an electromagnetic field strength calculation method of the invention.

As shown in this figure, the electromagnetic field strength calculation method of the invention includes step S1 of calculating currents flowing through elements of a model representative of an electric circuit device, step S2 of partitioning a face of the model with grid-forming lines having a predetermined spacing between adjacent lines, step S3 of calculating currents at grid intersections or at points within the partitioned areas according to the currents calculated in step S1, and step S4 of displaying the currents calculated in step S3.

The step S4 may include a step of performing a vector resolution of the calculated currents on the orthogonal coordinate system and a step of displaying the currents subjected to the vector resolution as a three-dimensional current distribution diagram using a hidden-surface-removed display.

In step S4, the calculated currents are displayed on the corresponding face of the model on the displayed diagram in the form of arrows, with their direction indicating the current direction and their length indicating the current magnitude.

The method of the invention may include a step of surrounding the face of the model with a rectangular area lying in the same plane, and a step of partitioning the area into subareas by grid-forming lines, and representing the area as a set of subareas each surrounded by the lines.

The method of the invention may further include a step of partitioning a face of the model which includes a triangular element or a quadrangular element into a plurality of areas with the grid-forming lines, and a step of calculating currents respectively corresponding to the plurality of areas using currents each calculated for a respective one of the sides of the triangular or quadrangular element, by means of the moment method.

The method of the invention may also include a step of receiving an input indicating one point or one element of the model and a step of setting a face on which the specified point or element lies as a face for current display. The method may further include a step of displaying each current in terms of its real part and imaginary part, or a step to display each current in terms of its absolute value and phase.

The method of the invention may also include a step of displaying a diagram of the model of the electric circuit device and a step of indicating a face of an object for current display of the displayed model. In the invention, the currents may be displayed in a plurality of scales by changing the mode of display of the arrows according to the magnitude of the currents displayed.

The method of the invention may further include a step of displaying the calculated currents in the form of an XY graph, in which the X axis represents the positions of multiple points specified as current display points, and the Y axis represents the magnitude of currents at the points. The plurality of points can be determined by specifying the starting point or value and the end point or value of the points.

The method of the invention may also include a step of calculating the distribution of current in a wire element in the electric circuit device, and may further include a step of displaying an XY graph, in which the X axis represents the positions of multiple points in the wire element, and the Y axis represents the magnitude of currents at the points of the wire element.

The electromagnetic field strength calculation method and the functions of the electromagnetic field strength calculator of the invention can be implemented by a computer program. A storage medium of the invention, which is a medium that stores the computer program, can be implemented by an optical disk, a magnetic disk, a magneto-optical disk, a ROM, or a RAM.

Figure 2A:
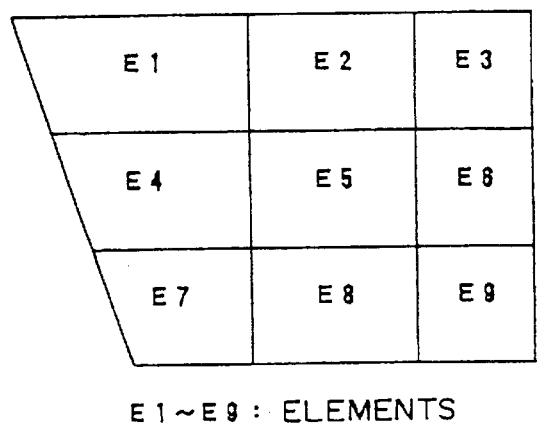
FIGS. 2A and 2B are diagrams for use in explanation of grid setup processing in the invention.
Figure 2B:
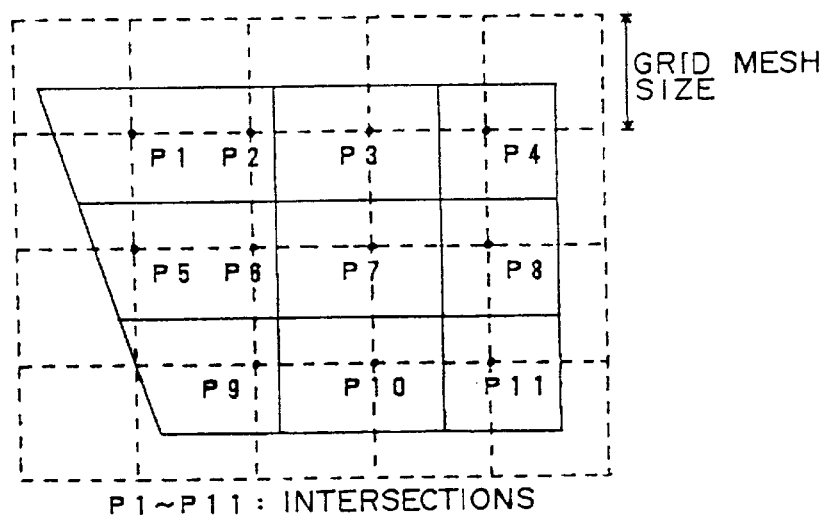

FIGS. 2A and 2B are diagrams for use in the explanation of a grid setup process in the invention.

In calculating currents for an electric circuit device which is an object of analysis by means of the moment method, the object is split into patches, or microelements, and the mutual impedance between each patch (element) is calculated. By solving simultaneous equations for the mutual impedances, currents flowing through the respective elements are calculated.

E1 through E9 in FIG. 2A represent elements on a face of an electric circuit device, each of which is used as a unit of calculation by the moment method. A current calculation is performed for each side of the elements E1 through E9. When the elements are too large or not uniform in size, it is difficult for users to analyze the displayed calculated currents.

Using the grid setup unit 14, a grid of lines of specified or predetermined spacing is set up on the face of the electric circuit device of FIG. 2A, as shown in FIG. 2B. On the basis of currents flowing through the sides of the respective elements E1 through E9 which have been calculated by the electromagnetic field strength calculation unit 12 using the moment method, the current calculation unit 15 calculates currents at grid intersections P1 through P11. After that, the current display unit 16 converts the calculated currents into a visible format and then displays them on the display unit 24.

This permits the currents flowing through various parts of the circuit device to be made visible on the same scale, facilitating the understanding of currents having effect on the strength of an electromagnetic field. Thus, it becomes possible to obtain information that is important for measuring electromagnetic waves emitted from the circuit device.

Figure 3:
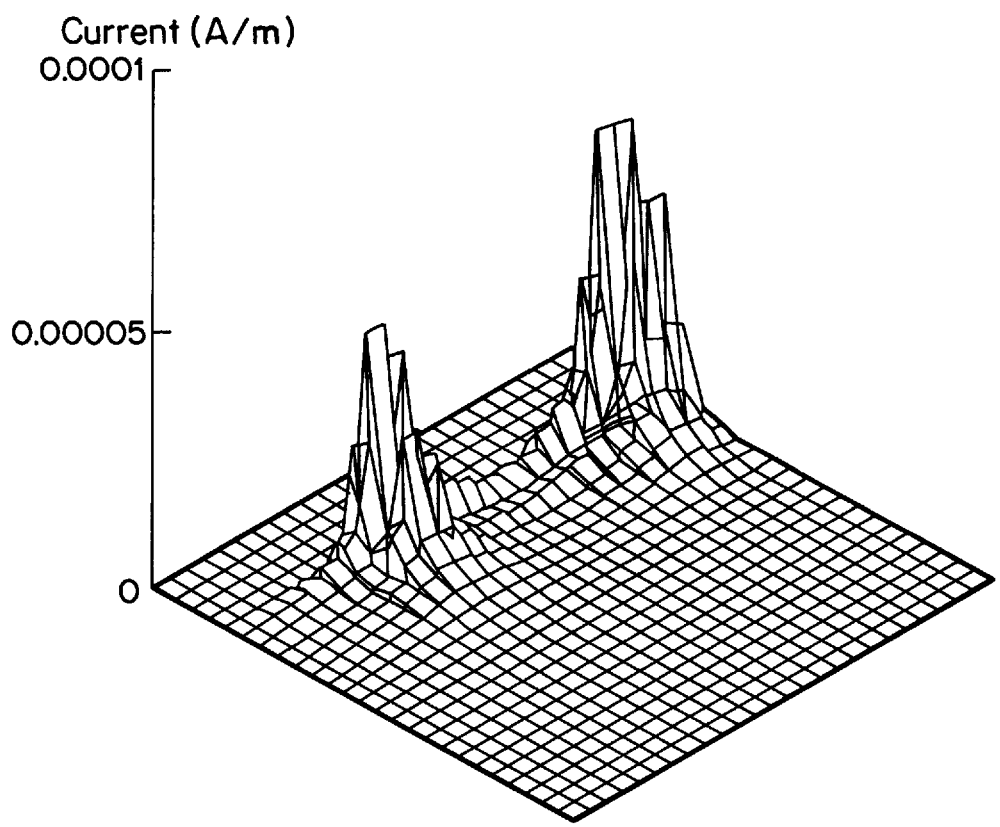
FIG. 3 shows a display example of a current distribution diagram according to the invention.

FIG. 3 shows a display example of a current distribution diagram according to the invention.

The currents calculated by the current calculation unit 15 are converted into vectors on an orthogonal coordinate system. The resulting magnitude of the currents in the X direction or Y direction is displayed as a three-dimensional or axonometric current distribution diagram, as shown in FIG. 3. Thus, the effect of the currents on the electromagnetic field strength in a direction of a current vector component can be understood easily.

Figure 4A:
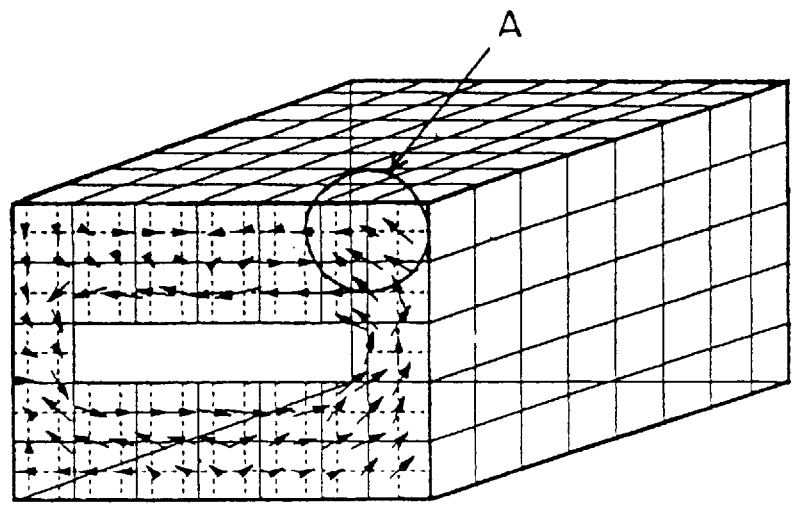
FIGS. 4A and 4B show a display example of a current vector diagram.
Figure 4B:
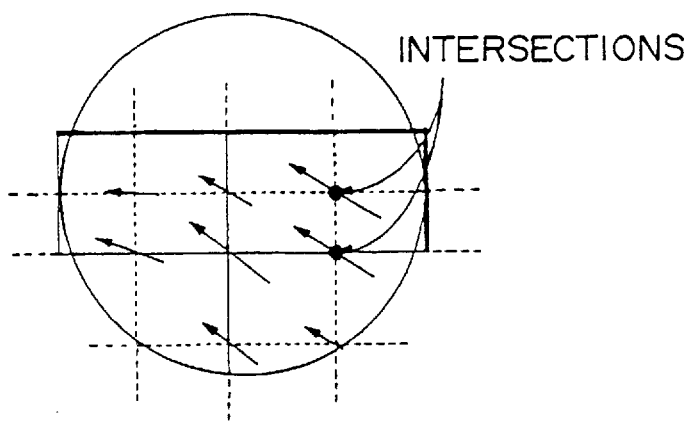

FIG. 4A shows a display example of a current vector diagram according to the invention, and FIG. 4B is an enlarged view of a section A in FIG. 4A. FIG. 4A shows the current vectors on the front face. In FIGS. 4A and 4B, bold solid lines represent the shape of a model of the electric circuit device, fine solid lines represent elements divided according to the moment method, and dotted lines represent the grid set up by the grid setup unit 14.

As shown in FIGS. 4A and 4B, the currents calculated by the current calculation unit 15 are displayed vectorially on the model diagram such that the length and direction of each arrow represent the magnitude and flow direction of the corresponding current, respectively. Therefore, the distribution of currents on the circuit device is displayed in a form easy to understand, which will provide important information for measuring the electromagnetic waves emitted from the circuit device.

Even if the face of the electric circuit device model selected for current display is of an irregular shape, currents are displayed regularly because the face is surrounded with a rectangular area and the area is partitioned into subareas by grid lines, as shown in FIG. 2B.

Also, even if the face for current display is, for example, triangular, currents are displayed regularly because the currents are displayed according to the subareas partitioned by grid-forming lines.

Figure 5A:
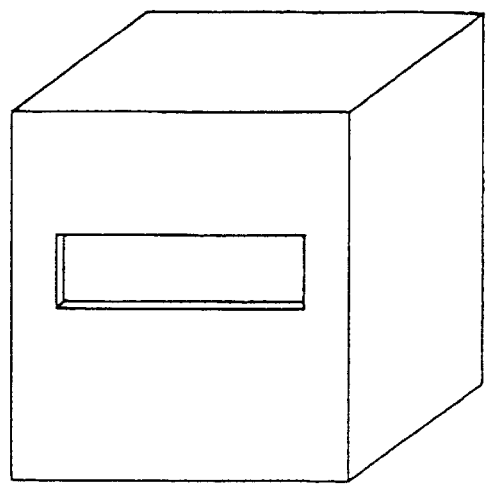
FIG. 5A shows an electric circuit device that is an object of analysis.
Figure 5B:
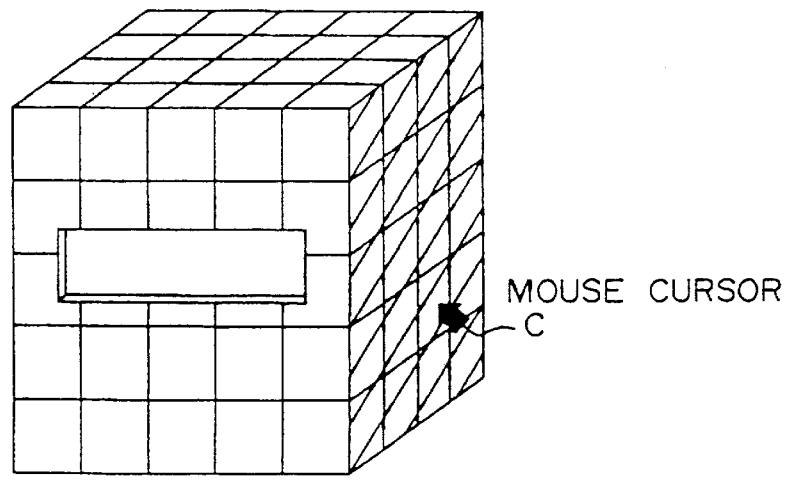
FIG. 5B shows a display example of a model diagram of the electric circuit device of FIG. 5A.

FIGS. 5A and 5B show a display example of a model of a electric circuit device according to the invention.

For example, when currents flowing through a cabinet of an electric circuit device having an opening in its front face, as shown in FIG. 5A, are analyzed, a model of the electric circuit device shown in FIG. 5B is displayed, and one point or one element is specified by means of, for example, a mouse cursor C, to select the face for current display. Alternatively, the number of a patches on a face to be displayed can be specified to select the face. Therefore, even if the faces of the electric circuit device are complicated, face currents which are to be analyzed can be easily selected and displayed.

The currents calculated by the current calculation unit 15 can be displayed as real and imaginary components, or their magnitude in absolute value and phase.

Further, the model diagram display unit 21 can indicate the face displayed by the current distribution diagram display unit 17 on the faces of the model in the three-dimensional model diagram. In the model diagram as shown in FIG. 5B, the relevant face is displayed in a specific color or with higher intensity.

Figures 6, 7:
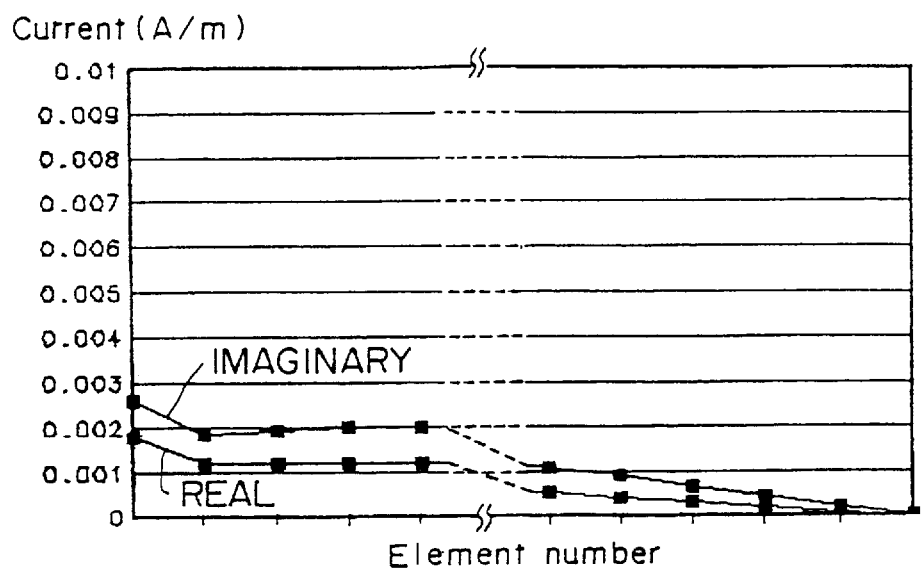
FIG. 6 shows an example of a classification by color of arrows indicating current values according to the invention.
FIG. 7 shows a display example of a current XY graph according to the invention.

FIG. 6 shows an example of displaying arrows by color according to the invention.

If, in such a display of a current vector diagram as shown in FIGS. 4A and 4B, arrows are displayed such that their length is proportional to their current magnitude, then a very high current will result in too long an arrow and a very low current will result in too short an arrow. In such a case, the current vector diagram display becomes difficult to understand.

For example, as shown in FIG. 6, when current values are 100 times or more relative to a standard value, the arrows (vectors) are displayed in red. For current values of more than 10 times and less than 100 times, the arrows are displayed in orange. For current values of $1/10$ to 10 times, the arrows are displayed in yellow. For current values of less than $1/10$ times and more than $1/100$ times, the arrows are displayed in green. For current values of $1/100$ times or less, the arrows are displayed in blue. Since the vectors are displayed by color in this manner, the current vector diagram can be displayed in such a way as to make vectors from low currents to high currents easier to view at one time. As an alternative, the arrows may be displayed such that their thickness varies according to the current magnitude.

FIG. 7 shows an example of a current XY graph according to the invention.

As shown in FIG. 7, the real and imaginary parts of currents can be displayed simultaneously in the form of an XY graph. This permits changes in current on a specific line to be understood readily, providing useful information for taking measures against electromagnetic waves. The current values may be displayed in terms of their absolute value and phase.

In displaying a current XY graph as shown in FIG. 7, the range for display can be specified by specifying the starting value and the end value of intersection points of the grid, by entering the numbers of these two points or by selecting the two points on the model diagram with a mouse, permitting quick and easy entry.

According to the invention, when a common mode current in a cable is displayed, the current XY graph as shown in FIG. 7 is used. Whether or not the cable has an effect on the generation of electromagnetic waves can be easily determined according to the current XY graph.

Figure 8:
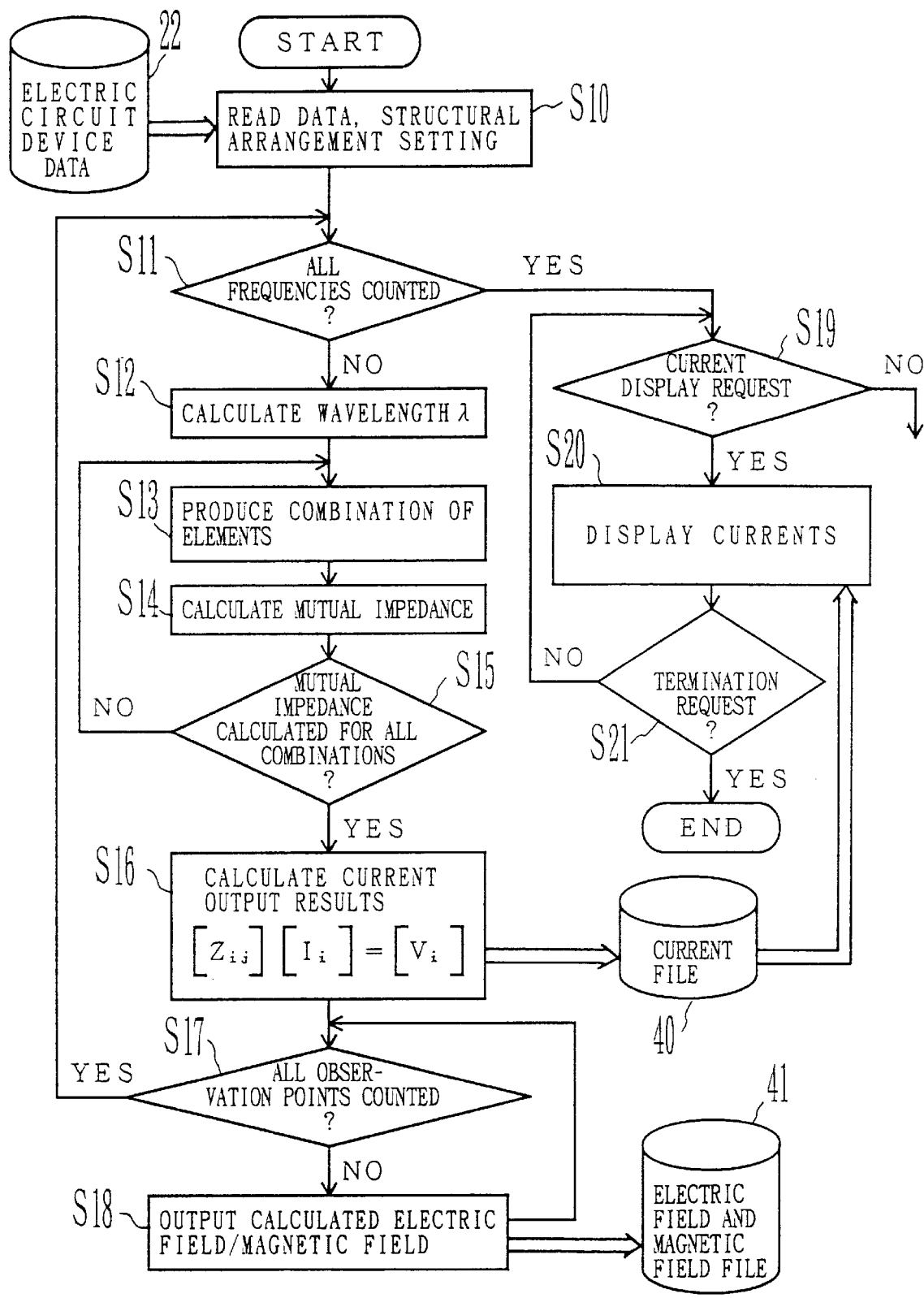
FIG. 8 is a flowchart for electromagnetic field strength calculation processing of the invention.

FIG. 8 is a flowchart for the calculation of electromagnetic field strength according to the invention.

First, in step S10, data 22 about an electric circuit device which is an object of analysis is input to the electromagnetic field strength calculator. The data is produced by CAD or the like. Portions to which the moment method is to be applied are divided into wires, surface patches, or elements, and the data necessary for calculation of currents is set as a structure array.

Next, the following processing is repeated for registered frequencies. In step S11, frequencies that have already been processed are totalled to make a decision as to whether or not the processing has been terminated for all the registered frequencies. If the decision is that the processing has been terminated, then the procedure goes to step S19. If unprocessed frequencies are left, a frequency to be processed next is selected from among the unprocessed frequencies, and then the wavelength of the selected frequency is calculated in subsequent step S12.

Next, in order to calculate mutual impedances Zij used in the simultaneous equations associated with the moment method, combinations of an element i (i=1 to m) and an element j (j=1 to m) are set for m metal elements of the electric circuit device, in step S13. In subsequent step S14, the mutual impedance Zij between combined elements is calculated. Steps S13 and S14 are repeated until the calculation is terminated for all of the combinations. When it is confirmed in step S15 that the mutual impedance has been calculated for all the combinations of elements, the procedure goes next to step S16.

In step S16, using the calculated mutual impedances Zij and wave source voltages Vi given as input data, the simultaneous equations according to the moment method involving currents Ii flowing through the metal elements as unknowns are derived as follows:

[Zij] [Ii]=[Vi]

This equation is solved for currents Ii. The currents Ii thus obtained are stored in a current file 40.

In subsequent step S17, observation points for which the process has been completed are counted so as to make a decision as to whether all of the registered observation points have been processed or not. If the decision indicates that all the observation points have not been processed, then the procedure goes to step S18 in which the strength of an electromagnetic field at an observation point generated by the calculated currents Ii is calculated in accordance with a predetermined expression for calculation. The result of this calculation is stored in an electric-field/magnetic-field file 41 and then the procedure returns to step S17. In this manner, the electric fields and magnetic fields are calculated for all the observation points. On termination of the processing for all the observation points, the procedure returns to step S11 and the same processes are repeated for the next frequency.

The calculations of the mutual impedances Zij, the calculations of currents in step S16, and the calculations of electric fields and magnetic fields in step S18 can be performed by using conventionally known methods. Thus, the detailed explanations thereof are omitted herein.

This invention can be applied to not only the case where the moment method is used for an entire electric circuit device but also the case where the moment method is used only for a portion of the electric circuit device. In addition, the distributed constant line approximation method can be applied to a portion that can be approximated by a one-dimensional structure to calculate currents for the portion.

If the decision in step S11 indicates that the calculations have been performed for all frequencies, then a decision is made in step S19 as to whether a current display request is present or absent. When such a request is absent, other requested processing is carried out. The other processing includes a process of graphically displaying the results of calculations stored in the electric-field and magnetic-field file 41 and the like.

When a current display request is present, the procedure goes to step S20, in which reference is made to the current file 40 which stores current values, each of which was calculated for a respective one of the metal elements, and the current values are displayed by the current display unit 16. After that, a decision is made in step S21 as to whether a termination request has been made. If the termination request has been made, then the procedure comes to an end. If not, then the procedure returns to step S19.

Figure 9:
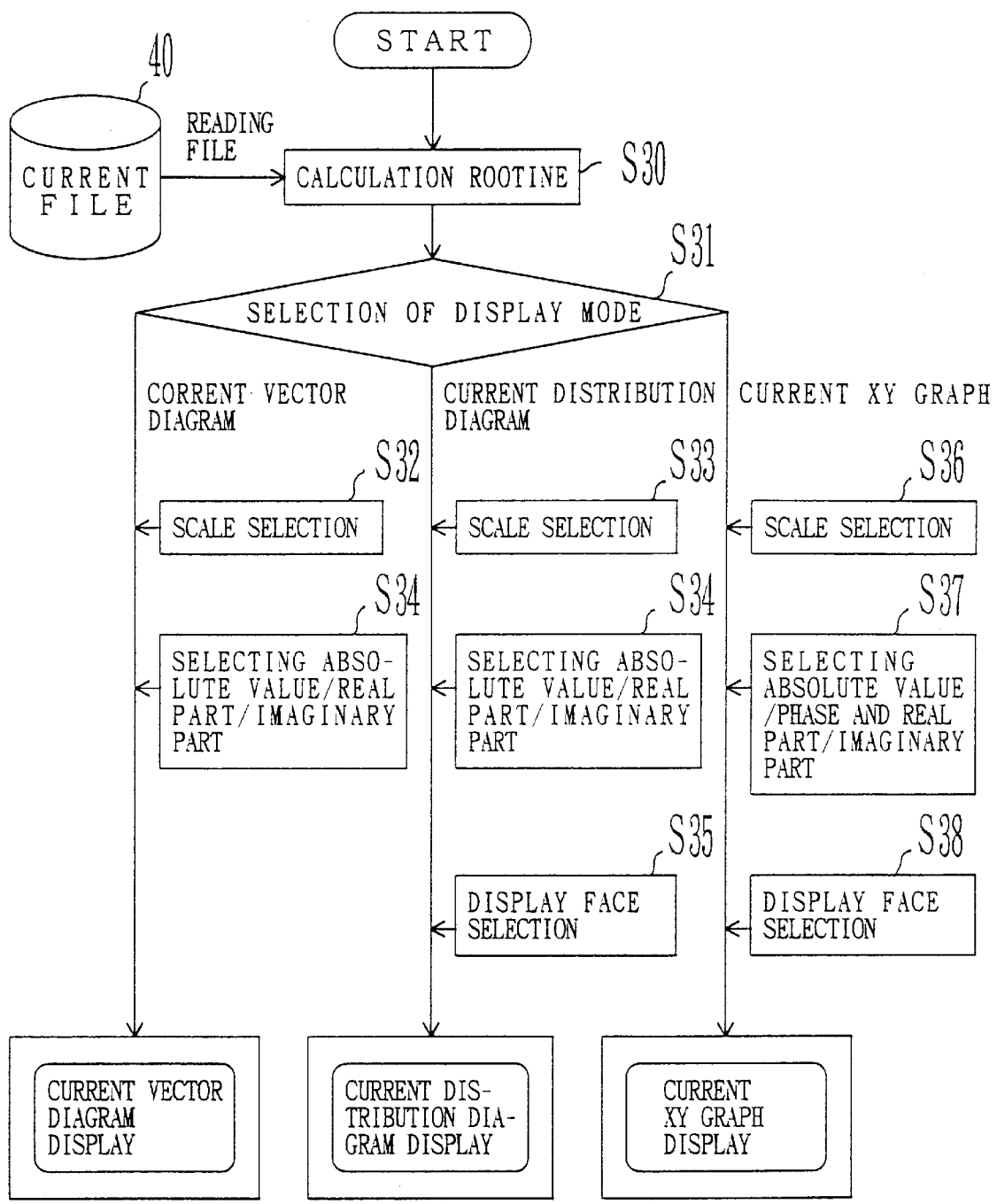
FIG. 9 is a flowchart showing the processing by the current display unit of the invention.

FIG. 9 is a flowchart for use in explanation of the processing by the current display unit 16. In step 20 of FIG. 8, the processing shown in FIG. 9 is performed by the current display unit 16.

First, in step S30, the current values of the respective metal elements are entered from the current file 40 and then currents at intersections of the grid or at points within the meshes of the grid are calculated. In subsequent step S31, one of current display modes is chosen by the user.

If a request to display a current vector diagram is made, then a scale to be displayed is selected in step S32, and a display item is selected from among absolute value, real part, and imaginary part in step S34, whereby such a current vector diagram as shown in FIG. 4A is displayed.

Figure 13:
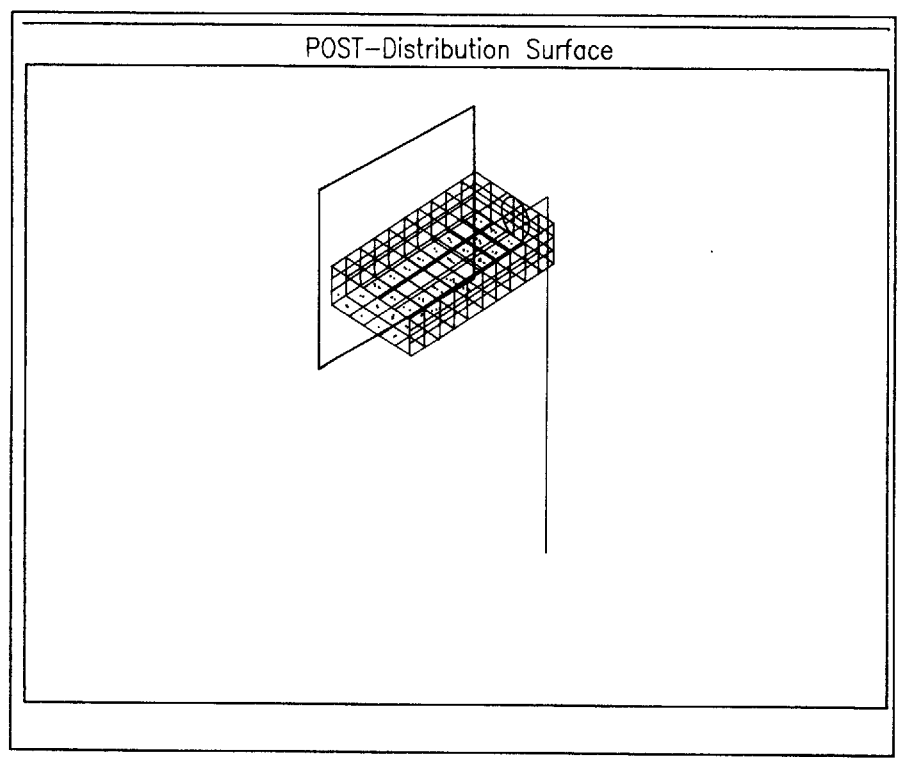
FIG. 13 shows an example of a display screen of a model diagram in the embodiment of the invention.

If a current distribution diagram is selected to be displayed in step 31, a scale for display is determined in step S33, a display item is selected from among the three items described above in step S34, and a face of the model is determined is step S35, so that a current distribution diagram as shown in FIG. 13 is displayed.

If a request is made to display a current XY graph, a scale to be displayed is selected in step S36. In subsequent step S37, a pair of display items is selected from among absolute value and phase and real and imaginary parts. In subsequent step S38, a face or wire to be displayed is selected. As a result, a current XY graph such as shown in FIG. 7 is displayed.

Figure 10:
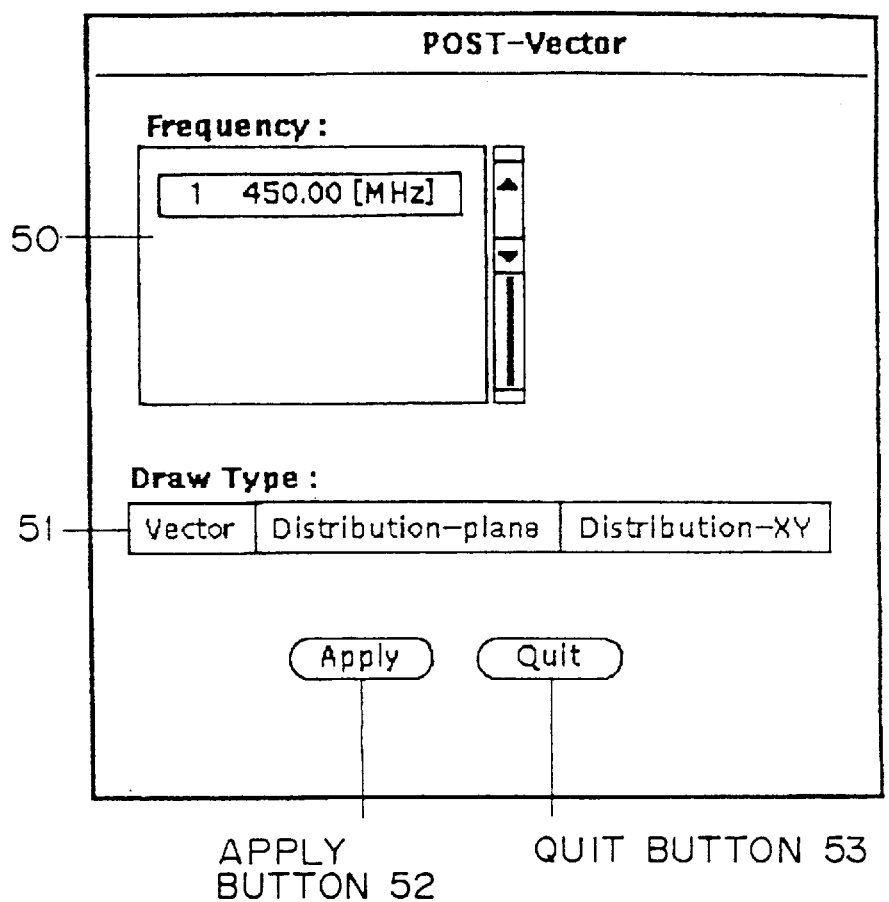
FIG. 10 shows an example of a current displaying parameter entry screen in an embodiment of the invention.

FIG. 10 shows an example of a parameter entry screen format for the current display.

When a request is made to display currents flowing through an electric circuit device, a parameter entry screen for the current display such as shown in FIG. 10 is displayed. In a frequency entry area 50 on the screen, a frequency to be used for calculations can be selected through the use of a keyboard or mouse. In a draw-type entry area 51, selecting "Vector" requests display of a current vector diagram. Selecting "Distribution-XY" requests display of a current distribution diagram. Selecting "Distribution-XY" requests display of a current XY graph.

Selecting an apply button 52 allows a current display based on the input parameters to be performed. Selecting a quit button 53 terminates the processing without executing a current display.

Figure 11:
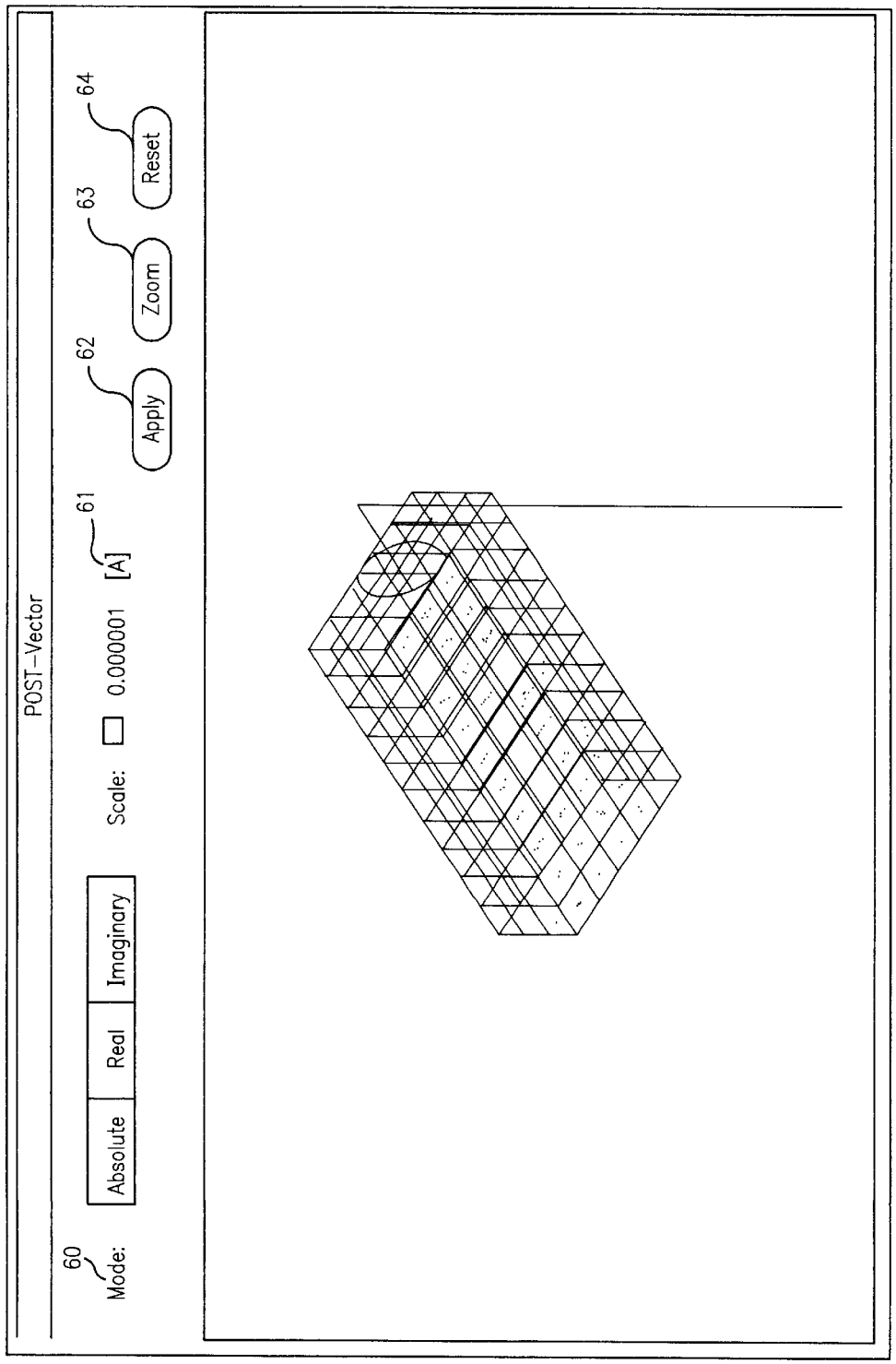
FIG. 11 shows an example of a display screen of a current vector diagram in the embodiment of the invention.

FIG. 11 shows an example of a current vector diagram display screen according to an embodiment of the invention.

When, in FIG. 10, "Vector" is selected in the draw-type entry area 51 and the apply button 52 is selected, a current vector diagram such as shown in FIG. 11 is displayed. In a mode specifying area 60 on this screen, a selection can be made among "Absolute", "Real"; and "Imaginary". When "Absolute" is selected, current values are displayed as absolute values. When "Real" is selected, currents are displayed in terms of the real components of currents calculated by complex numbers. And, when "Imaginary" is selected, currents are displayed in terms of the imaginary components of currents.

In the a scale entry area 61, the maximum scale of the current values can be set. When a button in the scale entry area 61 is selected with, for example, the right button of a mouse, a scale menu is displayed.

Selecting an apply button 62 allows currents to be displayed on the basis of the newly set parameters. Selecting a zoom button 63 allows the current display to be enlarged. When an area is dragged with the mouse after the button is selected, this area is displayed enlarged. Selecting a reset button 64 allows the screen to be reset.

Figure 12:
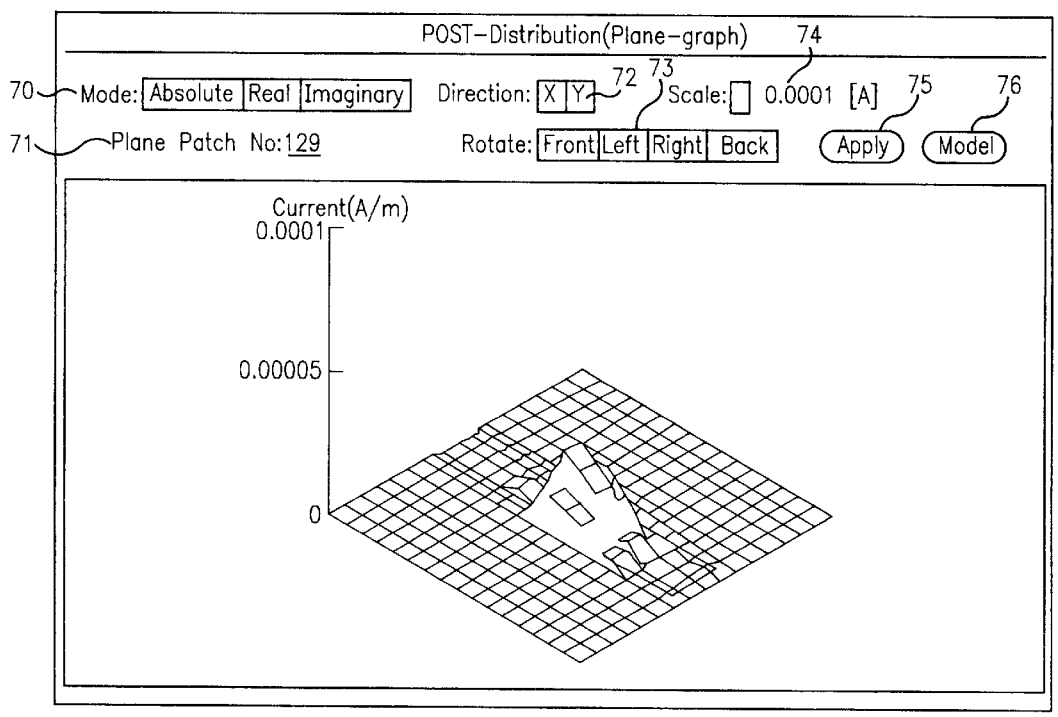
FIG. 12 shows an example of a display screen of a current distribution diagram in the embodiment of the invention.

FIG. 12 shows an example of a current distribution diagram display screen according to the embodiment of the invention.

When, in FIG. 10, "Distribution-plane" is selected in the draw-type entry area 51 and the apply button 52 is selected, a current vector diagram such as shown in FIG. 12 is displayed. In a mode specifying area 60 on this screen, a selection can be made among "Absolute", "Real", and "Imaginary". This provides an absolute-value-based current display, real-part-based current display, or imaginary-part-based current display. In a patch number entry area 71, one patch number on a face of the model is specified. By specifying the patch number, the face on which the element having the patch number lies is selected to be a display plane for the current distribution diagram.

Selecting one of the direction entry areas 72 allows selection between display of the distribution of current components vectorially resolved in the X-axis direction and display of the distribution of current components vectorially resolved in the Y-axis direction.

Selecting one of rotation specifying areas 73 allows the rotation of a current distribution diagram in a graphic area. The rotation is performed in units of 90 degrees. When one of "Front", "Left", "Right" and "Back" is selected, the current distribution diagram is rotated in the front, left, right, or back direction, respectively.

A scale entry area 74 allows a scale of a current distribution diagram to be selected. Selecting an apply button 75 provides a current display based on the newly set parameters.

Selecting a model button 76 allows a model diagram to be displayed to make sure which face of an electric device the plane of the current distribution diagram displayed in the graphic area corresponds to. FIG. 13 shows an example of a model diagram displayed on the screen by selecting the model button 76. In the model diagram, the face in the current distribution diagram is displayed in a specific color. The reference line is displayed as a bold line so as to be used as the criterion.

Figure 14A:
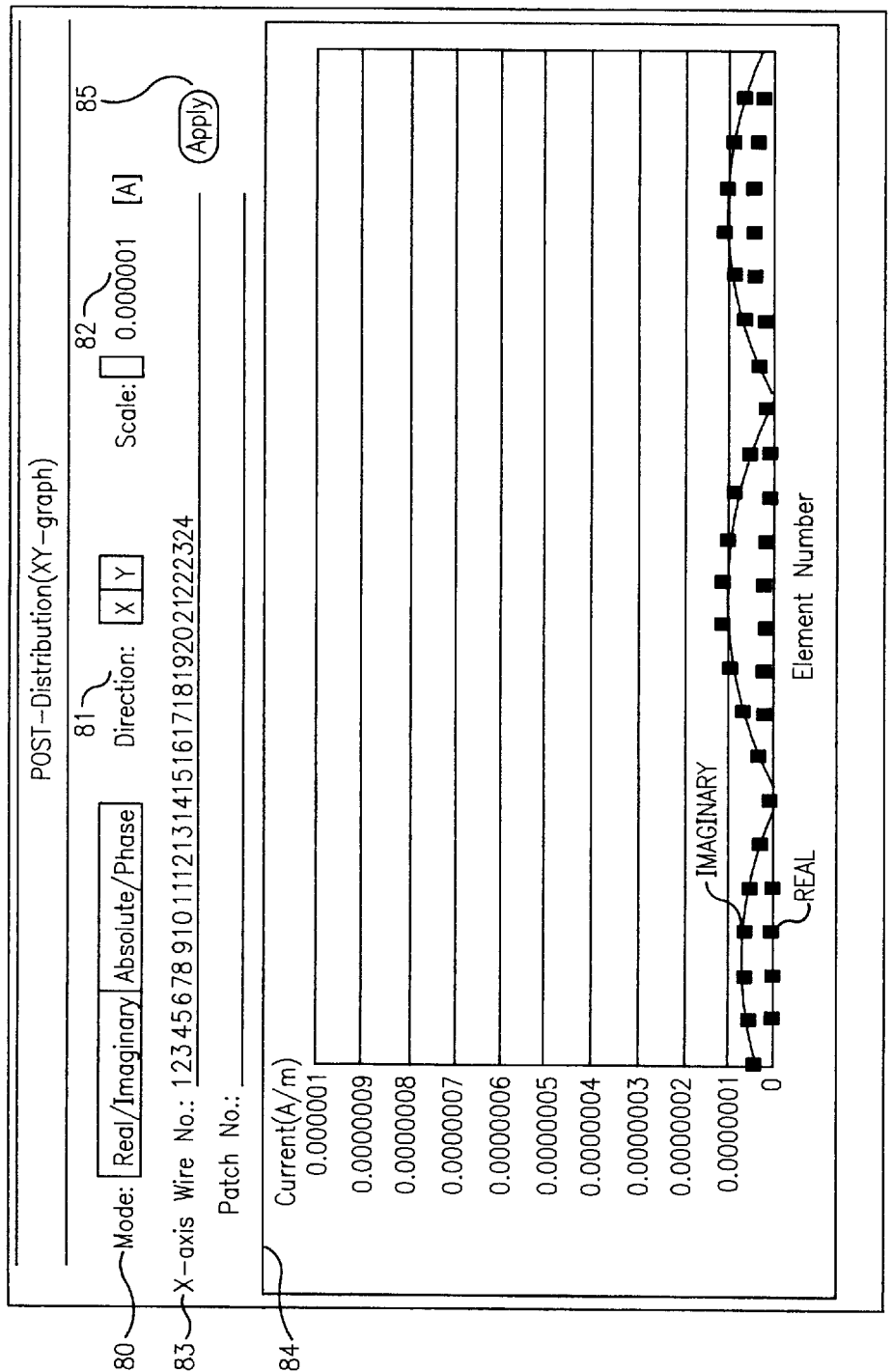
FIGS. 14A and 14B show current XY graph display screens in the embodiment of the invention.
Figure 14B:
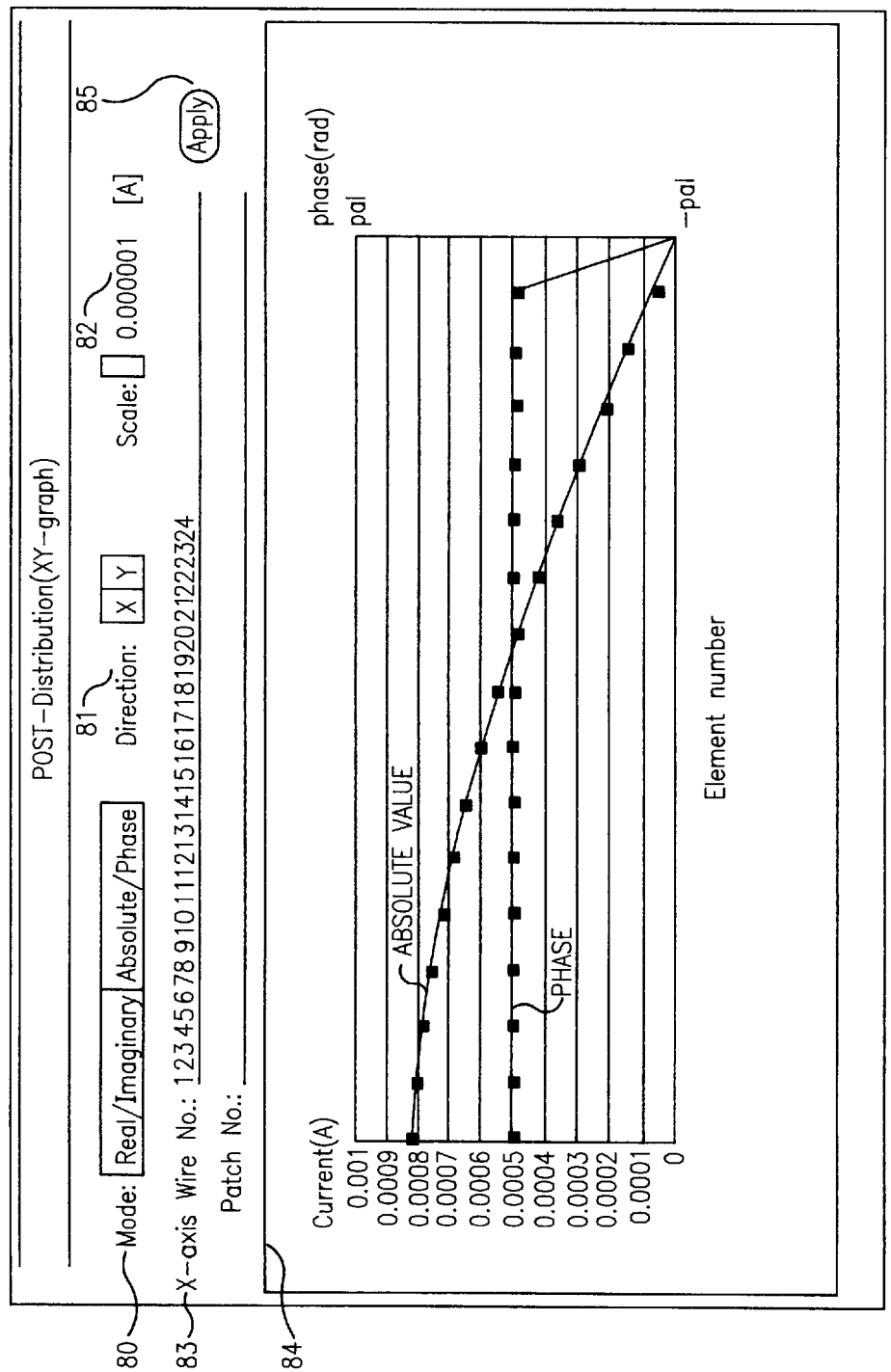

FIGS. 14A and 14B each show an example of a current XY graph display screen in an embodiment of the invention.

When "Distribution-XY" is selected in the draw-type entry area 51 in FIG. 10 and the apply button 52 is selected, a current XY graph as shown in FIG. 14A or 14B is displayed. In a mode specifying area 80 in this display screen there are select buttons for "Real/Imaginary" and "Absolute/Phase", whereby, when one of them is clicked, either a graph as shown in FIG. 14A in which real and imaginary parts of currents are indicated simultaneously, or a graph as shown in FIG. 14B in which absolute values and phase of currents are indicated simultaneously is displayed.

A direction entry area 81 allows currents in the X-axis direction or in the Y-axis direction to be selectively displayed. In a scale entry area 82, a scale of the current values to be displayed is selected.

A wire number entry area 83 allows the number of a selected wire element to be specified for the display. When the numbers are consecutive, the entry can be made in an efficient manner by the use of a format like "starting number—ending number". In the case of a display of currents that flow on faces, not through wires, a range of patch numbers is entered from a patch number entry area 84. Selecting an apply button 85 allows a current display based on the newly set parameters to be executed.

Reference will now be made to FIGS. 15A, 15B, 16A to 16C, and 17A to 17C to describe a method of calculating a current at each intersection of a grid set up by the grid setup unit 14, using currents flowing along the sides of elements (patches) calculated by the moment method.

Figure 15A:
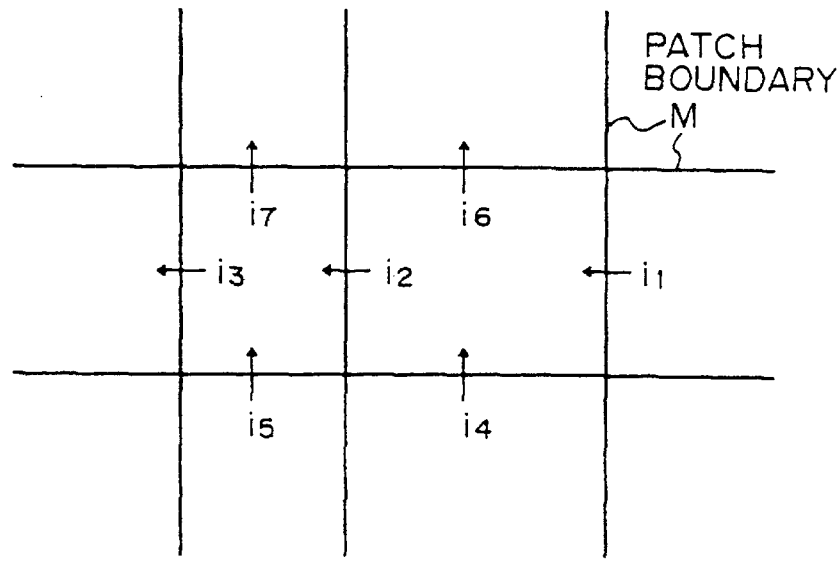
FIGS. 15A, 15B, 16A, 16B, 16C, 17A, 17B, 17C, and 17D illustrate a current calculation method in the embodiment of the invention.
Figure 15B:
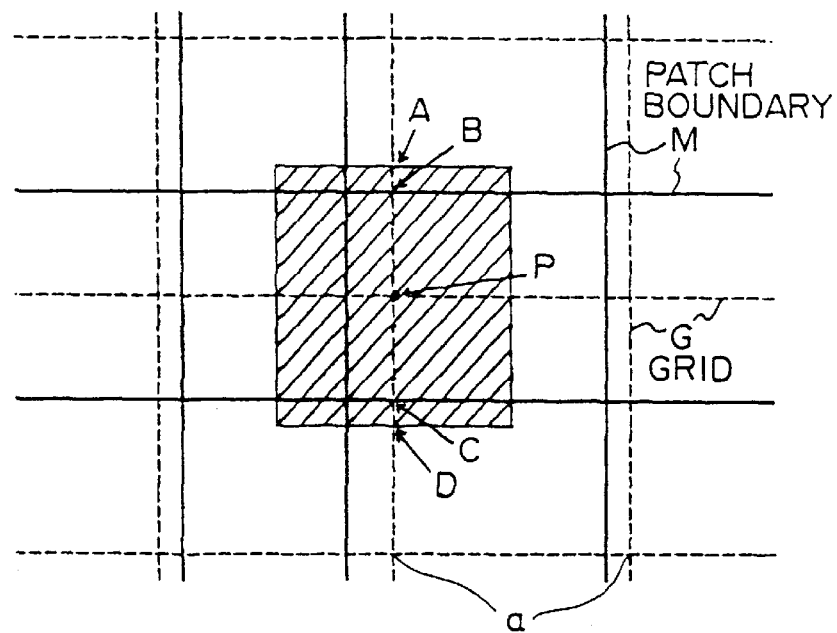

First, a description will be made of a case where the patches are rectangular elements. In FIG. 15A, M denotes patch boundaries and represents a side of each element according to the moment method. In the moment method, as is well known, current values I1 to I7 of currents flowing along the sides of the elements are calculated. The patches are not uniform in size and shape. According to the invention, therefore, a grid G of lines is set up as shown in FIG. 15B, with the line spacing being determined in advance or specified by the user, and a current value is calculated for each point in an element divided by the grid. In the present embodiment it is supposed that a current value is sought for each grid intersection P. The same method can also be used to calculate a current at the central point between the elements, not at the grid intersection P. The current value at grid intersection P represents current values within an area indicated by oblique lines in FIG. 15B.

The current at grid intersection P is calculated in terms of vertical and horizontal components (i.e., components in the X and Y directions). In order to calculate current values within the area indicated by oblique lines in FIG. 15B from current values I1 to I7 shown in FIG. 15A, it is required to consider the current values in the six surrounding patches. Hereinafter, the calculations of currents in the horizontal direction will be described. The calculations of currents in the vertical direction can be performed in the same way. A flow of the processing is as follows:

(a) Which patches an area represented by a point at which a current value to be calculated is included in are determined, and currents flowing through the sides (edges) of the patches are obtained.

(b) The current densities are calculated using the currents of opposite sides.

(c) The current densities are resolved and composed in the grid direction.

(d) Currents within the range of that point are calculated as the current density from the current densities obtained in (c).

Figure 16A:
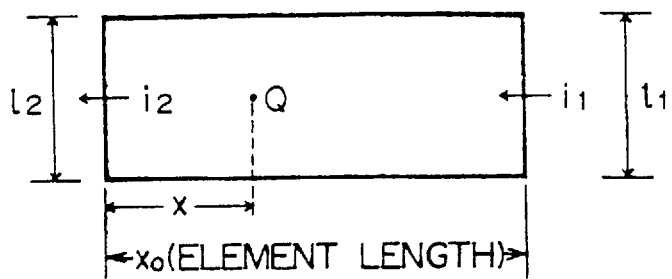
Figure 16B:
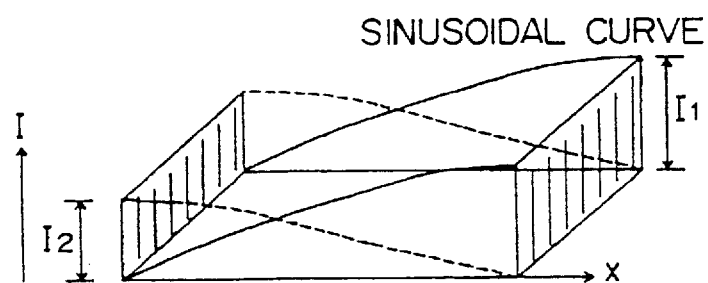

Calculating the current density from currents of opposite sides will be described with reference to FIGS. 16A, 16B, and 16C. Suppose now that the current density at a point Q in FIG. 16A is calculated from the currents i1 and i2 in the sides that are opposite to each other in the horizontal direction. Given parameters include the frequency f, the side lengths l1 and l2, the currents i1 and i2 flowing through the opposite sides, the element length $x_0$, and the distance x between the left side and the point Q.

The current densities I1 and I2 in the sides through which the currents i1 and i2 flow are I1=i1/l1 and I2=i2/l2, respectively. The current flowing through a patch is represented by a sinusoidal curve. A graphical representation of the magnitude of the current between the opposite sides is as shown in FIG. 16B.

Figure 16C:
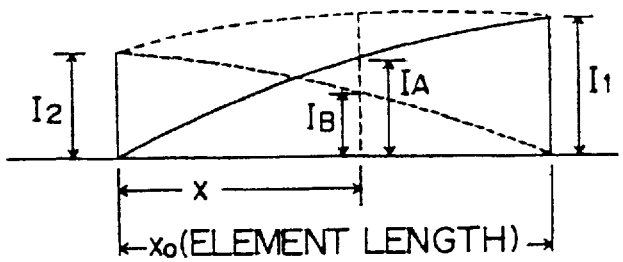

With the current density I1, the current IA at the point Q shown in FIG. 16C is calculated as follows:

$$IA = A \sin(2\pi x/\lambda) = A \sin(2\pi x \cdot f/c)$$

where c is the velocity of light and hence equals 300,000 Km/sec. Supposing that the unit of x is a meter and the unit of f is a megahertz, IA becomes $$IA = A \sin(2\pi x \cdot f/300)$$

A has the following value:

$$A = I1/\sin(2\pi x_0 \cdot f/300)$$

Likewise, the current IB at the point Q according to the current density I2 is represented as follows:

$$IB = B \sin(2\pi(x_0-x) \cdot f/300)$$

where $B = I2/\sin(2\pi x_0 \cdot f/300)$.

Thus, the current density I at the point Q in the horizontal direction is obtained as follows:

$$I = IA + IB$$

From the current density at arbitrary points thus calculated, a current representing currents within a range is calculated as a current density. Parameters required for this calculation include current densities (in the horizontal and vertical directions) already calculated for a patch, and the length a of one side of a grid mesh. For example, the current density in the area indicated by oblique lines in FIG. 15B is calculated as follows.

To calculate the current density in the horizontal direction in the area indicated by oblique lines and containing the point P, the current density of a current flowing between points A and D which are in the range of half the distance a from the point P is calculated.

For the current flowing between points A and B, use is made of the current density calculated for the patch containing the point A (called the first patch). For the current flowing between points B and C, use is made of the current density sought for the patch containing the point P (called the second patch). For the current flowing between points C and D, use is made of the current density sought for the patch containing the point D (called the third patch).

Suppose that the current density in the first patch in the horizontal direction is Ix1, the current density in the second patch in the horizontal direction is Ix2, and the current density in the third patch in the horizontal direction is Ix3.

Then, the current flowing between points A and B is iAB=Ix1·AB (AB is a distance between the points A and B)

The current flowing between points B and C is iBC=Ix2·BC (BC is a distance between the points B and C)

The current iCD flowing between points C and D is iCD=Ix3·CD (CD is a distance between the points C and D)

Thus, the current density Ix0 of currents flowing through the area indicated by oblique lines in FIG. 15B is found to be $$Ix0 = (iAB + iBC + iCD)/a$$

The current density in the vertical direction (Y direction) can also be found in the same manner.

Figure 17A:

The above description relates to the calculation of the current density for a rectangular element. When a patch in the moment method is a triangular element as shown in FIG. 17A, current densities in three directions are sought. The opposite side of a triangle corresponds to an each vertex of the triangle. When the value of a current flowing through a side of a triangle is i1, the current value i2 at the corresponding vertex is assumed to be i2=0. Inputs include the following:

i1=the value of a current flowing through an side i2=0 x=distance from a vertex l1=the length of a side

Figure 17B:
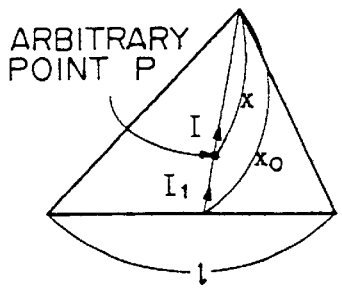

From these values the current density I at an arbitrary point in the direction toward a vertex shown in FIG. 17B is calculated by means of similar calculations to those for a rectangle, described in connection with FIGS. 16A to 16C. The current density is calculated for three sides or three verteces, and the results are added to obtain currents in the horizontal and vertical directions.

Figure 17C:
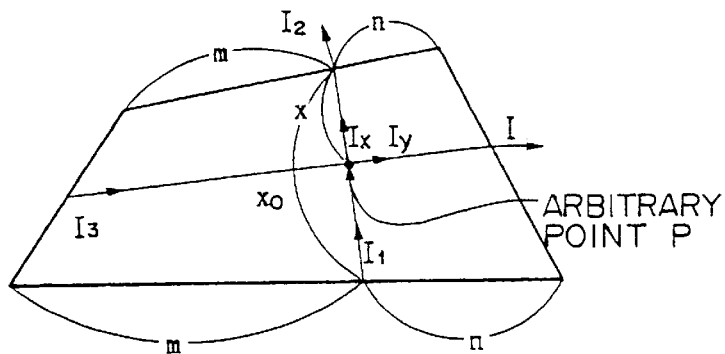

When a patch element is such a general quadrangle as shown in FIG. 17C, current densities Ix and Iy in two directions are calculated. In this case, consider a straight line which passes through an arbitrary point and intersects points that divide the opposite sides in a ratio of m:n. By using this straight line, x and x0 are obtained. Ix is calculated from I1 and I2 and Iy is calculated from I3 and I4.

Figure 17D:
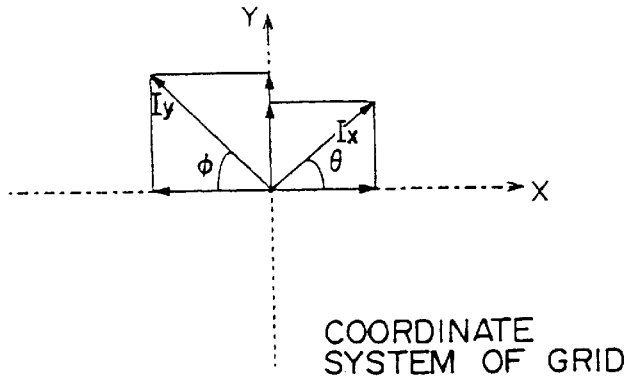

To convert Ix and Iy obtained in FIG. 17C into current densities Ix0 and Iy0 in the grid coordinate system, the following expressions related by angles $\phi$ and $\theta$ as shown in FIG. 17D are used:

$$Ix0 = \cos\phi \cdot Iy - \cos\theta \cdot Ix$$

$$Iy0 = \sin\phi \cdot Iy + \sin\theta \cdot Ix$$

Figure 18A:
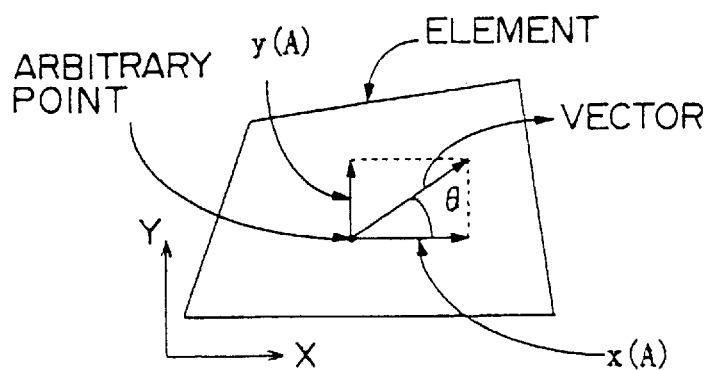
FIGS. 18A and 18B illustrate a method of calculating a current vector in the embodiment.
Figure 18B:
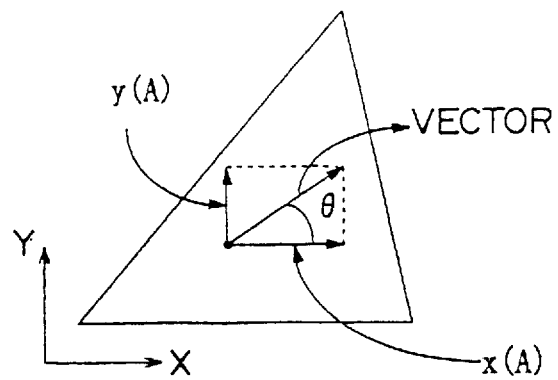

FIGS. 18A and 18B are diagrams for use in explanation of calculation of a current vector.

Suppose that, at a grid intersection, a current x(A) in the horizontal direction and a current y(A) in the vertical direction have been obtained by the above-described calculations. In the case of a quadrangular element, the direction and magnitude of a current I are obtained as shown in FIG. 18A. The magnitude of the current I is $$|I|=(x^2+y^2)^{1/2}$$

where x and y are current values in complex numbers.

The angle θ shown in FIG. 18A is obtained by $$\theta=\tan^{-1}(y/x)$$

wherein θ=π/2 if x=0.

In the case of a triangular element, the magnitude and direction of a current are calculated as shown in FIG. 18B, as in the case of the rectangular element, and the results are displayed.

$$|I|=(X^2+y^2)^{1/2}$$
$$\theta=\tan^{-1}(y/x)$$

wherein θ=π/2 if x=0.

The absolute values and real and imaginary parts of currents required to display a current distribution diagram can also be obtained by the above calculations. Also, the values (absolute values and phase) required to display a current XY graph can be calculated.

For a wire portion in the model of an electric circuit device, the current distribution for each wire element is calculated by means of the moment method or the distributed constant line approximation method, to indicate the calculated currents in the form of a current XY graph. The current density at an arbitrary point on a wire is obtained by the same method as that shown in FIG. 16C, using currents I of the respective wire elements obtained by the moment method or the distributed constant line approximation. In this case, however, unlike the case where a current at an arbitrary point is obtained from the currents of each patch, the current density is obtained by first obtaining a current at an arbitrary point on a wire element and then dividing that current by the diameter of the wire.

Next, the way to calculate a current by means of the distributed constant line approximation method will be described. The distributed constant line approximation method is used, for example, to obtain a current flowing through a pattern on a printed circuit board on which a electric circuit is formed, and the result is added to the current distribution of the electric circuit obtained by the use of the moment method.

Figure 19A:
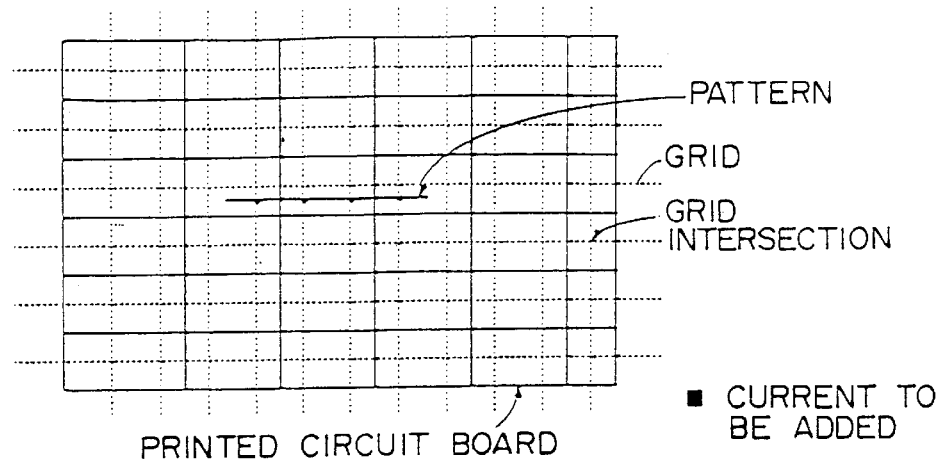
FIGS. 19A, 19B and 19C illustrate a current calculation method based on the distributed constant line approximation method.
Figure 19B:
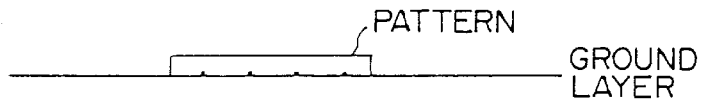
Figure 19C:
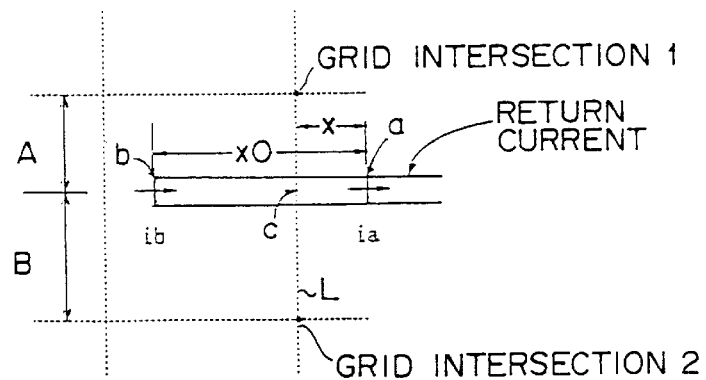

FIG. 19A shows segmentation of a pattern on a printed circuit board, FIG. 19B is a sectional view of the circuit board, and FIG. 19C is an enlarged view of the pattern portion. Through the ground layer of the circuit board, a return current, that is of the same magnitude as but opposite in phase (polarity) to a pattern current, flows. Although a current flowing through the ground layer can be calculated by means of the moment method to display the current distribution in the pattern, the return current is not included in the current distribution. The return current can be obtained by means of the distributed constant line approximation method and added to that current distribution obtained by means of the moment method.

First, return currents ia and ib at points a and b respectively on the pattern are obtained by means of the distributed constant line approximation method. Next, using these currents, the distance x between the point a and a grid intersection (or an arbitrary point) C, and the distance x0 between the points a and b, the current value I at the point C is obtained using the same method as that illustrated in FIGS. 16A to 16C. Finally, to obtain currents at grid intersections 1 and 2, the current densities I1 and I2 to be respectively added to the currents at the grid intersections 1 and 2 are obtained as follows:

$$I1=I/(A+B)\cdot A/(A+B)$$
$$I2=I/(A+B)\cdot B/(A+B)$$

A: distance between the grid intersection 1 and the wire

B: distance between the grid intersection 2 and the wire

When the return current does not flow at right angles with respect to the line L connecting the grid intersections 1 and 2, it is resolved into a component in the direction parallel to the line L and a component perpendicular to that component, and the current densities I1 and I2 obtained by the following equations are added to the currents obtained for the grid intersections 1 and 2

$$\begin{aligned} I1 &= I'/(A+B)\cdot A/(A+B) \\ &= I\cos\theta/(A+B)\cdot A/(A+B) \\ I2 &= I'/(A+B)\cdot B/(A+B) \\ &= I\cos\theta/(A+B)\cdot B/(A+B) \end{aligned}$$

where θ is an angle between the line L or the line perpendicular to the line L and the flow direction of the return current.

It is possible to obtain the current density to be added to each grid point on the basis of the pattern current in the same way as above.

Figure 20:
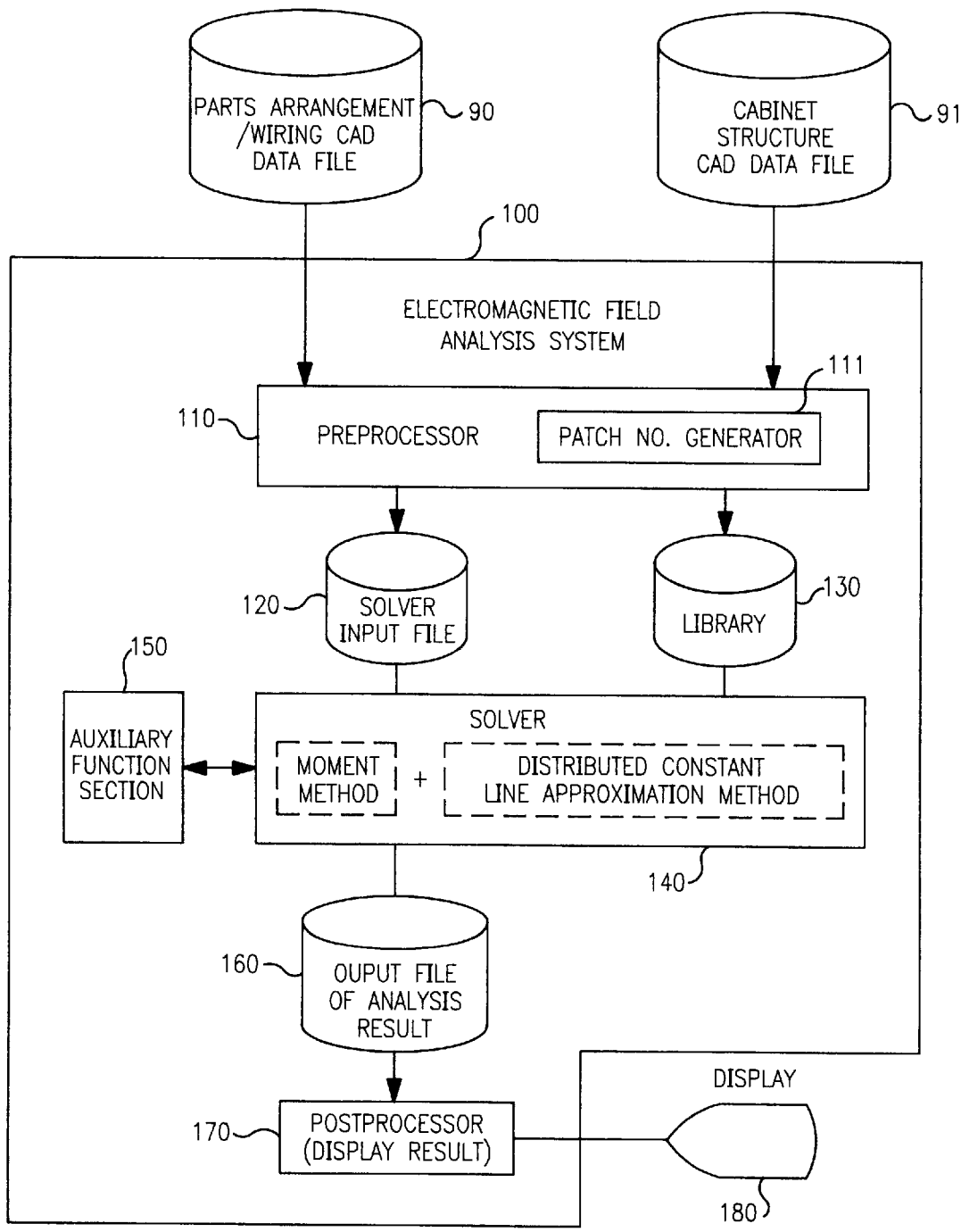
FIG. 20 is a schematic diagram showing a specific system configuration for realizing the invention.

FIG. 20 shows an example of a system configuration that embodies the invention. An apparatus arrangement/wiring CAD data file 90 is a file that stores data on the external shape of a printed circuit board, pin information for an apparatus of driver/receiver, wire lines, and the like, which are prepared by an electronic CAD system. A cabinet structure CAD data file 91 is a file that stores structure-CAD-system-prepared cabinet structure data in the NASTRAN format, that is a standard interface in the field of analysis.

An electromagnetic field analysis system 100, which corresponds to the electromagnetic field calculator 10 shown in FIG. 1A, comprises a preprocessor 110, a solver input file 120, a library 130, a solver 140, an auxiliary function section 150, an output file 160 for outputting the results of an analysis, and a postprocessor 170.

The preprocessor 110 receives data on a printed circuit board from the CAD data file 90, converts it into solver input data, and outputs it to the solver input file 120. Also, the preprocessor receives from the cabinet structure CAD data file 91 cabinet structure data necessary for analysis on the cabinet level, converts it into solver input data, and outputs it to the solver input file 120. In conversion into solver input data, the routes of various cables between printed circuit boards or entering/exiting the cabinet are prepared. In addition, printed board wiring information once captured and the cabinet structure are modified. The preprocessor 110 has a function of specifying the location where a printed circuit board is mounted, and comprises a patch number generator 111.

The solver 140, which is a module that analyzes the electromagnetic field strength, analyzes each of objects of analysis on the basis of input data from the solver input file 120, and library information on parts used on a printed circuit board from the library 130, in accordance with the moment method or the distributed constant line approximation method, and outputs the results of analysis to the output file 160.

The postprocessor 170 receives the results of analysis from the output file 160 and graphically displays the results in a specified form on a display 180. For example, display forms include the following:

(1) Frequency spectrum diagram (2) Radiation pattern diagram (3) Electromagnetic field map (4) Impedance spectrum diagram (5) Current distribution diagram (6) Current vector diagram (7) Current XY graph (8) Worst net pattern The auxiliary function section 150 provides a solver interruption and restart function for interrupting the processing of the solver 140, confirming the intermediate results, and restarting the processing. In addition, the auxiliary function section 150 provides a function of displaying the status of the solver 140 to indicate the progress of the analysis the solver 140 is now processing.

The electromagnetic field analysis system 100 conducts a practical analysis of a printed circuit board, a cable, and a cabinet, and can acquire information which indicate how electromagnetic waves are radiated and the radiation mechanism, such as the effect of coupling between a printed circuit board and a cable, the effect of shielding by a metal plate, the current distribution on an object surface, and the like.

Figure 21:
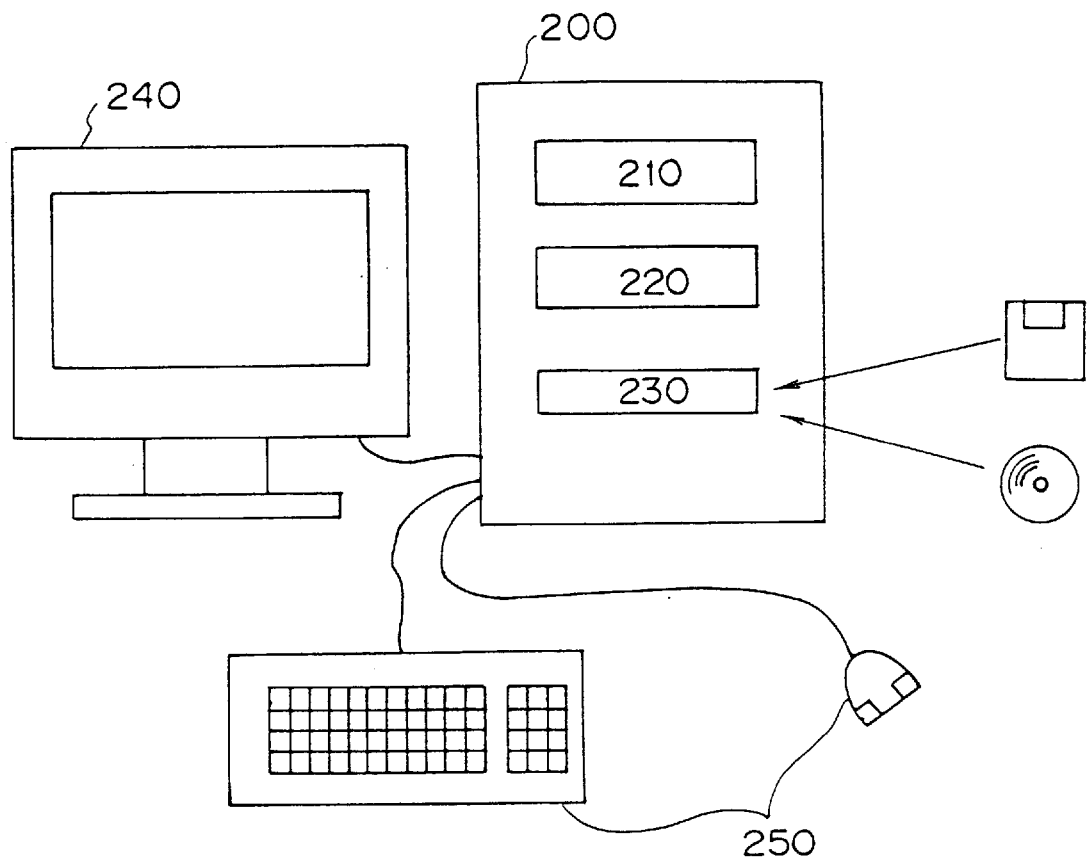
FIG. 21 is a schematic diagram showing a computer system for realizing the invention.

FIG. 21 shows a computer system for realizing the electromagnetic field strength calculation system according to the invention. The computer system performs the electromagnetic field strength calculation method according to the invention.

The computer system comprises a computer 200, a display 240, and an entry device 250. The computer 200 comprises a processor 210, a memory 220, and a driver 230 for storage medium, and the entry device 250 includes a keyboard and a mouse.

The processor 210 performs each processes in above described embodiment, and corresponds to the electromagnetic field strength calculation unit 12 and analysis information output unit 13 in FIG. 1A, and preprocessor 110, solver 140, auxiliary function section 150, and postprocessor 170 in FIG. 20.

The memory 220 stores data and files, which include diagrams and graphs, used of made in the electromagnetic field strength calculator 10 in FIG. 1A, and stores those used in the electromagnetic field analysis system 100 in FIG. 20 including solver input file 120, library 130, output file 160. The electric circuit device data 22 in FIG. 1A and cad data files 90 and 91 in FIG. 20 may be stored in the memory 220.

The driver 230 is used for exchanging data between the computer 200 and storage medium, and corresponds to the data entry unit 11 in FIG. 1A and a device for inputting the cad data files 90 and 91 to the electromagnetic field analysis system 100 in FIG. 20. The storage medium may be implemented by an optical medium, a magnetic medium, and a mangeto-optic medium including a floppy disk, a CD-ROM, MD, or the like. The electric circuit device data 22 in FIG. 1A and cad data files 90 and 91 in FIG. 20 may be stored in the storage medium. Further, the programs, which realize the method according to the invention and can be carried out by the computer 200, may be stored in the storage medium.

The display 240 and the entry device 250 correspond to the display unit 24 and the entry unit 23 in FIG. 1A, respectively, and also correspond to the display 180 and a device for inputting user's directions to the analysis system 100 in FIG. 20, respectively.

What is claimed is:

1. An electromagnetic field strength calculator, comprising:

a grid setup unit that partitions a face of a model representing an electric circuit device with a grid of lines having a specified spacing;

a current calculation unit that calculates at least one first current at one of a point of intersection between lines of the grid and a point within an area partitioned by the grid, the at least one first current being calculated on the basis of at least one second current, as calculated by a moment method, flowing through corresponding elements of the model; and a current display unit that displays the at least one first current.

2. The calculator according to claim 1, wherein said current display unit includes a current distribution diagram display unit that converts the at least one first current into at least one vector on an orthogonal coordinate system and displays the vectors as an axonometric current distribution diagram.

3. The calculator according to claim 1, wherein: the at least one first current has a direction and magnitude; and said current display unit includes a current vector diagram display unit that displays a displayed model representing the model and displays the at least one first current as a corresponding arrow on a corresponding face of the displayed model, the direction and magnitude of the first current being respectively indicated by a direction and magnitude of the corresponding arrow.

4. The calculator according to claim 1, wherein said grid setup unit: surrounds the face of the model by a rectangular area; partitions the rectangular area into a plurality of subareas by the grid of lines; and represents the rectangular area as the plurality of subareas.

5. The calculator according to claim 1, wherein: the face of the model includes at least one element selected from a triangular element and a guadrangular element; said grid setup unit partitions the face into a plurality of subareas by said grid of lines; and the at least one first current corresponding to one of the plurality of subareas and the at least one second current used to calculate the first current is calculated for a side of an element included in the at least one selected elements.

6. The calculator according to claim 1, further comprising a face select unit that selects a face of the model to be displayed by said current display unit, the face being selected in response to an input indicating a feature selected from a point on the face and an element on the face.

7. The calculator according to claim 1, wherein said current display unit includes a current XY graph display unit that represents the at least one first current by a corresponding real component and a corresponding imaginary component.

8. The calculator according to claim 1, wherein said current display unit includes a current XY graph display unit that represents the at least one first current by a corresponding absolute value and a corresponding phase.

9. The calculator according to claim 1, further comprising a model diagram display unit that displays a diagram of the model and indicates a face of the model as a face for display of the at least one first current.

10. The calculator according to claim 3, wherein the current vector diagram display unit displays each of the arrows in a display mode selected in accordance with the magnitude of the first current displayed as the arrow.

11. The calculator according to claim 1, wherein said current display unit includes a current XY graph display unit that displays the at least one first current on an XY graph including an X axis that represents a location of the point for which the first current is calculated and a Y axis that represents a magnitude of the first current.

12. The calculator according to claim 11, wherein the points specified for current display are determined by specifying a starting point and an ending point.

13. The calculator according to claim 1, wherein said current calculation unit calculates a current distribution in a wire element in the electric circuit device.

14. The calculator according to claim 13, wherein said current display unit includes a current XY graph display unit that displays the at least one first current on an XY graph including an X axis that represents the respective locations of points along the wire element and a Y axis that represents for each of the points a magnitude of a corresponding one of the first currents.

15. An electromagnetic field strength calculator, comprising:
a grid setup unit that partitions a face of a model representing an electric circuit device with a grid of lines having a specified spacing;
a current calculation unit that calculates at least one first current at respective points selected from points of intersection between lines of the gird and points within a space partitioned by the grid, each first current being calculated on the basis of at least one second current flowing through corresponding elements of the model, each second current being calculated by a moment method or a distributed constant line approximation method; and
a current display unit that displays the at least one first current.

16. An electromagnetic field strength calculating method, comprising the steps of:
calculating, by a moment method, first currents flowing through an element of a model representing an electric circuit device;
partitioning a face of the model with a grid of lines having a specified spacing;
calculating second currents on the basis of the first currents, each second current being calculated at a point of intersection between lines of the grid or a point within an area partitioned by the grid; and
displaying the second currents.

17. The method according to claim 16, wherein the step of displaying includes the steps of: converting the second currents into one or more vectors on an orthogonal coordinate system; and displaying the vectors as an axonometric current distribution diagram.

18. The method according to claim 16, wherein each of the second currents has a corresponding direction and magnitude and the step of displaying includes the steps of: displaying a displayed model representing the model; and displaying the second currents on a corresponding face of the displayed model, the direction and magnitude of each of the second currents being indicated respectively by a direction and a magnitude of a corresponding arrow.

19. The method according to claim 16, further comprising the steps of: surrounding a face of the model by a rectangular area; and partitioning the rectangular area into a plurality of subareas by a grid of lines, whereby the rectangular area is represented as the plurality of subareas.

20. The method according to claim 16, wherein: the face of the model includes one or more elements selected from a triangular element or a quadrangular element;
in the partitioning step the face is partitioned by the grid of lines into a plurality of areas;
in the second current calculating step, each of the second currents corresponds to one of the plurality of areas; and in the first current calculating step, each of the first currents is calculated for a side of an element included in the one or more selected elements.

21. The method according to claim 16, further comprising the steps of: selecting a feature included in a point included in the model and an element of the model; and selecting a face including the selected feature as a face to be displayed.

22. The method according to claim 16, wherein the displaying step includes the step of representing each of the one or more second currents by a corresponding real component and a corresponding imaginary component.

23. The method according to claim 16, wherein the displaying step includes the step of representing each of the second currents by a corresponding absolute value and a corresponding phase.

24. The method according to claim 16, further comprising the steps of: displaying a diagram of the model; and indicating a face of the model as a face for displaying the second currents.

25. The method according to claim 18, wherein the displaying step includes the step of selecting a display mode for each of the arrows in accordance with the magnitude of the corresponding second current, whereby the second currents are displayed in multiple scales.

26. The method according to claim 16, wherein the displaying step includes the step of displaying each of the second currents on an XY graph including an X axis that represents a location of the point for which the second current is calculated and a Y axis that represents a magnitude of the second.

27. The method according to claim 26, wherein the respective points of the second currents are determined by specifying a starting point and an ending point.

28. The method according to claim 16, further comprising the step of calculating a current distribution in a wire element in the electric circuit device.

29. The method according to claim 28, wherein the displaying step includes the step of displaying each of the second currents on an XY graph including an X axis that represents a location of the point for which the second current is calculated and a Y axis that represents a magnitude of the second current.

30. An electromagnetic field strength calculating method, comprising the steps of:
calculating first currents flowing through an element of a model representing an electric circuit device, each of the first currents being calculated by a moment method or a distributed constant line approximation method;
partitioning a face of the model with a grid of lines having a specified spacing;
calculating second currents, each second current being calculated on the basis of the first currents at a point of intersection between lines of the grid or a point within an area partitioned by the grid; and
displaying the second currents.

31. A storage medium readable by a computer, tangibly embodying a program of instructions executable by the computer to perform a electromagnetic field strength calculating method the program comprising the functions of:
calculating at least one first current flowing through an element of a model representing an electric circuit device, the at least one first current being calculated by a moment method or a distributed constant line approximation method;
partitioning a face of the model with a grid of lines having a specified spacing;

calculating at least one second current, on the basis of the at least one first current at a point of intersection between lines of the grid or a point within an area partitioned by the grid; and displaying the at least one second current.

32. The calculator according to claim 1, wherein said current calculating unit calculates each of the at least one first current on the basis of one of the at least one second current.

33. The method according to claim 16, wherein each of the at least one second current is calculated in the second current calculating step on the basis of one of the at least one first current.

* * * * *